United States Patent
Own et al.

(10) Patent No.: US 10,847,343 B1
(45) Date of Patent: Nov. 24, 2020

(54) MICROSCOPY

(71) Applicant: Mochii, Inc., Seattle, WA (US)

(72) Inventors: Christopher Su-Yan Own, Seattle, WA (US); Matthew Francis Murfitt, Seattle, WA (US)

(73) Assignee: Mochii, Inc., Seattle, WA (US)

( * ) Notice: Subject to any disclaimer, the term of this patent is extended or adjusted under 35 U.S.C. 154(b) by 0 days.

(21) Appl. No.: 15/899,349

(22) Filed: Feb. 19, 2018

Related U.S. Application Data

(63) Continuation of application No. 15/426,024, filed on Feb. 6, 2017, now Pat. No. 9,899,186, which is a
(Continued)

(51) Int. Cl.
*H01J 37/28* (2006.01)
*C23C 14/54* (2006.01)
(Continued)

(52) U.S. Cl.
CPC ............. *H01J 37/28* (2013.01); *C23C 14/24* (2013.01); *C23C 14/52* (2013.01); *C23C 14/54* (2013.01);
(Continued)

(58) Field of Classification Search
CPC .. H01J 37/28; H01J 37/20; H01J 37/18; H01J 37/244; H01J 37/04; H01J 37/06; H01J 37/261; H01J 37/1471; H01J 37/16; H01J 37/185; H01J 37/21; H01J 37/222; H01J 37/226; H01J 37/228; H01J 37/26; H01J 37/302; H01J 2237/162; H01J 2237/04924; H01J 2237/06316; H01J 2237/3175; H01J 2237/0203; H01J 2237/03; H01J 2237/1405; H01J 2237/16; H01J 2237/18; H01J 2237/1825; H01J 2237/188; H01J 2237/2003; H01J 2237/2006; H01J 2237/2007; H01J 2237/2008; H01J 2237/24564; H01J 2237/248; H01J 2237/2594; H01J 2237/2605; H01J 2237/28; H01J 2237/2802;
(Continued)

(56) References Cited

U.S. PATENT DOCUMENTS

| 4,516,026 A * | 5/1985 | Jouffrey | H01J 37/18 250/310 |
| 6,897,443 B2 * | 5/2005 | Gross | H01J 37/28 250/441.11 |

(Continued)

*Primary Examiner* — David A Vanore
(74) *Attorney, Agent, or Firm* — Nienstadt PLLC

(57) ABSTRACT

A charged-particle beam microscope is provided for imaging a sample. The microscope has a vacuum chamber to maintain a low-pressure environment. A stage is provided to hold a sample in the vacuum chamber. The microscope has a charged-particle beam source to generate a charged-particle beam. The microscope also has charged-particle beam optics to converge the charged-particle beam onto the sample and a detector to detect charged-particle radiation emanating from the sample. The microscope has a controller to analyze the detected charged-particle radiation to generate an image of the sample. A power supply is provided that has a battery to power at least the charged-particle beam optics and the controller.

23 Claims, 15 Drawing Sheets

Related U.S. Application Data continuation of application No. 14/742,697, filed on Jun. 17, 2015, now Pat. No. 9,564,291, which is a continuation-in-part of application No. 14/607,079, filed on Jan. 28, 2015, now Pat. No. 9,997,331.

(60) Provisional application No. 62/013,514, filed on Jun. 17, 2014, provisional application No. 61/932,159, filed on Jan. 27, 2014.

(51) Int. Cl.
*C23C 14/52* (2006.01)
*C23C 14/24* (2006.01)
*H01J 37/22* (2006.01)
*H01J 37/244* (2006.01)
*H01J 37/10* (2006.01)
*H01J 37/20* (2006.01)
*H01J 37/18* (2006.01)

(52) U.S. Cl.
CPC ............ *H01J 37/10* (2013.01); *H01J 37/18* (2013.01); *H01J 37/20* (2013.01); *H01J 37/222* (2013.01); *H01J 37/244* (2013.01); *H01J 2237/0203* (2013.01)

(58) Field of Classification Search
CPC ...... H01J 2237/2813; H01J 2237/2817; G01N 23/2204; G01N 23/2251; G01N 30/603; G01N 30/6043; G01N 30/6091; G01N 30/6095
USPC ...... 250/310, 306, 307, 311, 440.11, 441.11, 250/442.11, 491.1, 492.3
See application file for complete search history.

(56) References Cited

U.S. PATENT DOCUMENTS

| | | | | |
|---|---|---|---|---|
| 7,261,812 | B1* | 8/2007 | Karp | B01D 15/1864 210/198.2 |
| 7,491,934 | B2* | 2/2009 | Jesse | G01N 23/2204 250/306 |
| 8,309,921 | B2* | 11/2012 | Bierhoff | H01J 37/16 250/310 |
| 8,586,923 | B1* | 11/2013 | Tromp | G01N 23/2251 250/306 |
| 8,598,527 | B2* | 12/2013 | Own | C12Q 1/6869 250/306 |
| 9,177,757 | B2* | 11/2015 | Ban | H01L 22/12 |
| 9,564,291 | B1* | 2/2017 | Own | H01J 37/28 |
| 9,899,186 | B1* | 2/2018 | Own | H01J 37/28 |
| 2004/0238739 | A1* | 12/2004 | Gross | H01J 37/28 250/310 |
| 2007/0145266 | A1* | 6/2007 | Cohen | H01J 37/04 250/310 |
| 2007/0145267 | A1* | 6/2007 | Adler | H01J 37/04 250/310 |
| 2007/0181825 | A1* | 8/2007 | Yoshikawa | G03F 7/70616 250/491.1 |
| 2008/0054180 | A1* | 3/2008 | Silver | H01J 37/244 250/307 |
| 2015/0136979 | A1* | 5/2015 | Tachibana | H01J 37/21 250/310 |
| 2015/0144804 | A1* | 5/2015 | Ando | H01J 37/28 250/442.11 |
| 2015/0170875 | A1* | 6/2015 | Ban | H01L 22/12 250/310 |
| 2015/0243477 | A1* | 8/2015 | Stone | G01N 23/2255 250/310 |
| 2015/0243478 | A1* | 8/2015 | Lee | H01J 37/3056 204/192.11 |
| 2016/0086769 | A1* | 3/2016 | Kim | H01J 37/3005 250/310 |

* cited by examiner

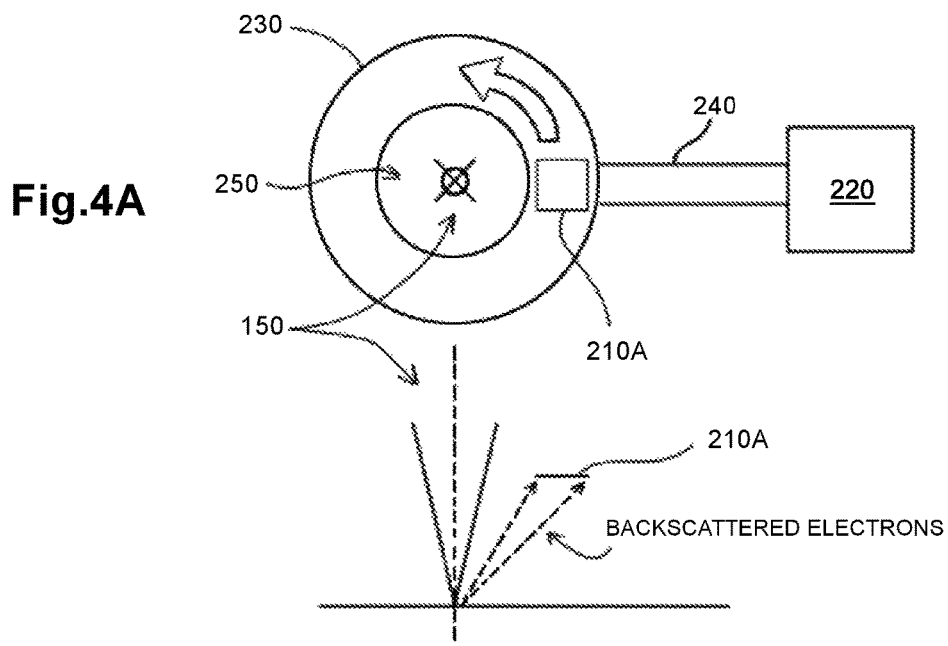
Fig.4A
Fig.4B
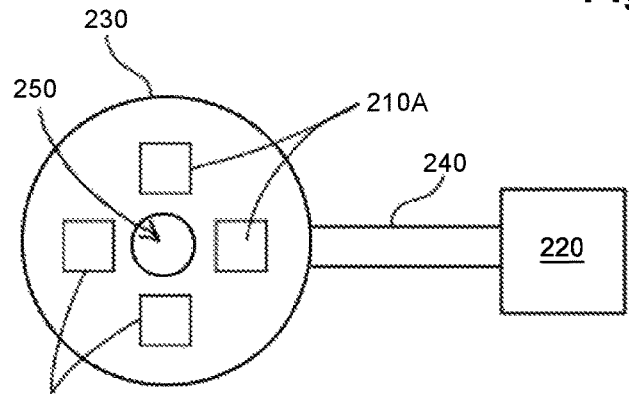
Fig.4C
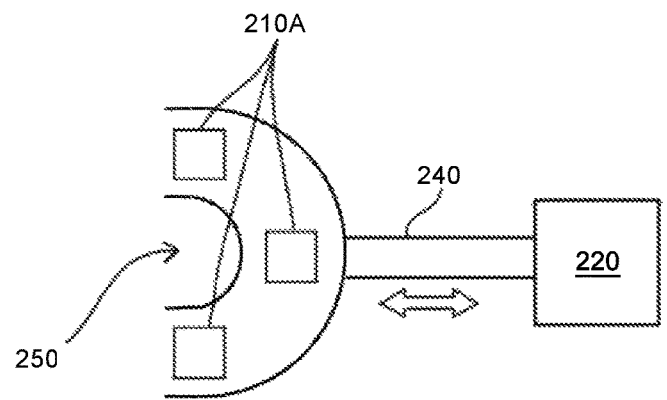
Fig.4D

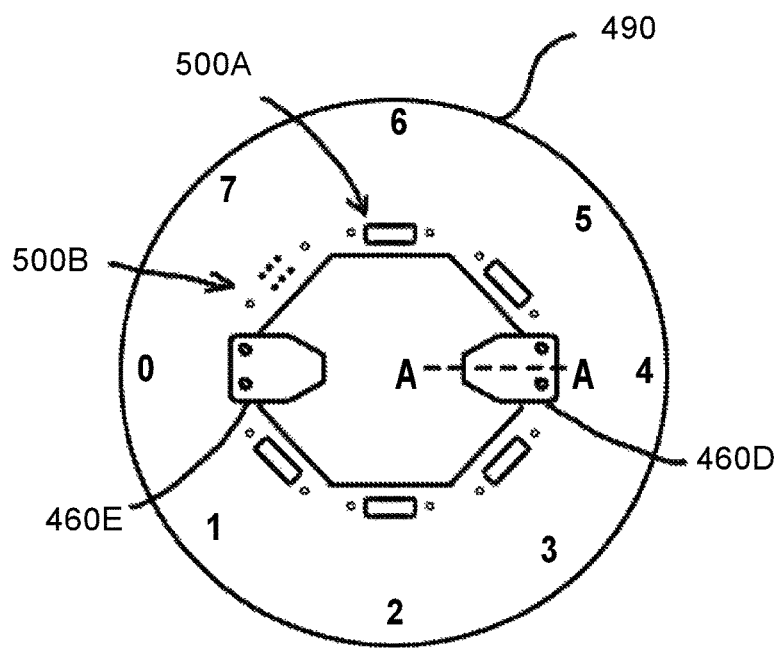
Fig.8A
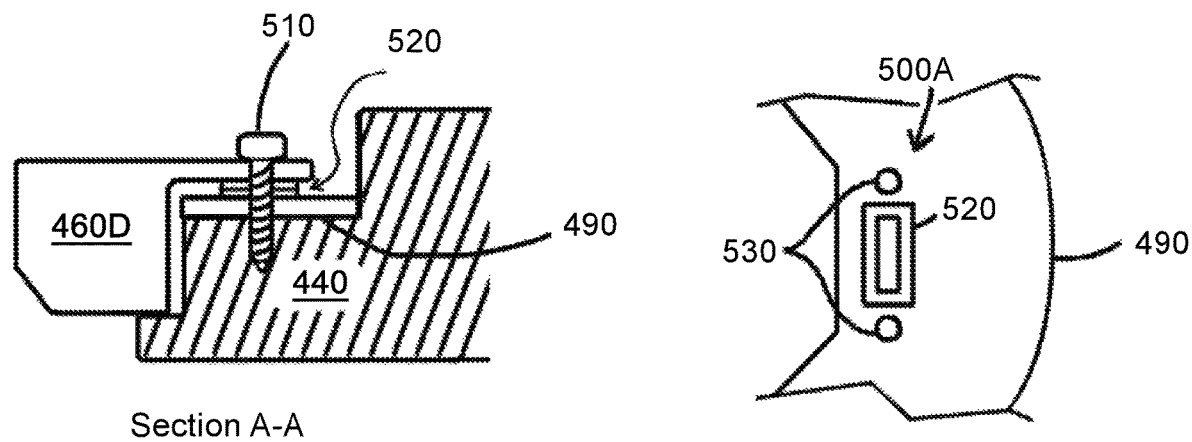
Section A-A
Fig.8B
Fig.8C

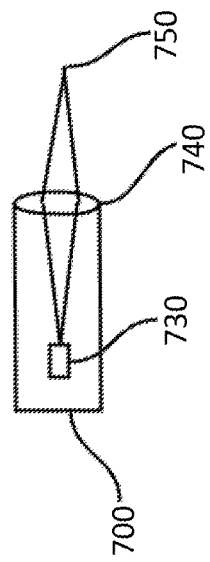
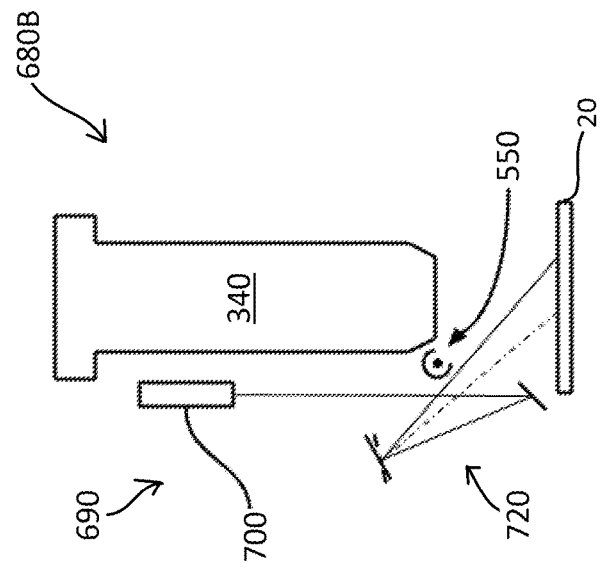
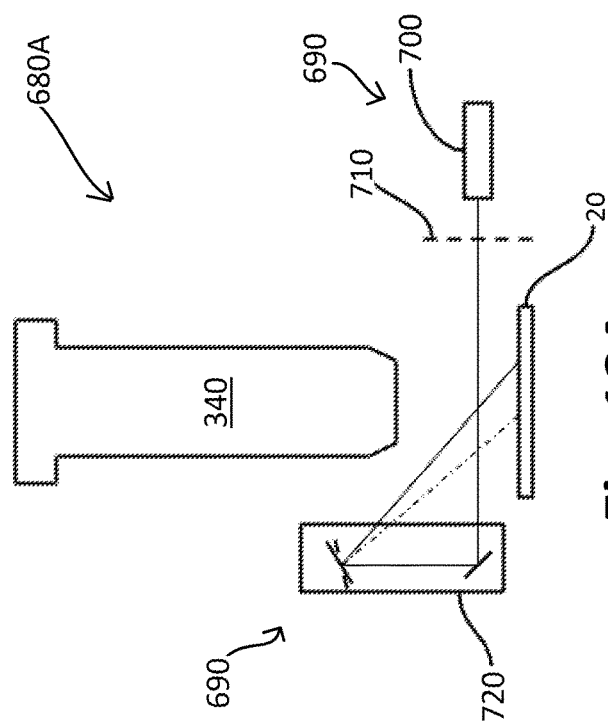
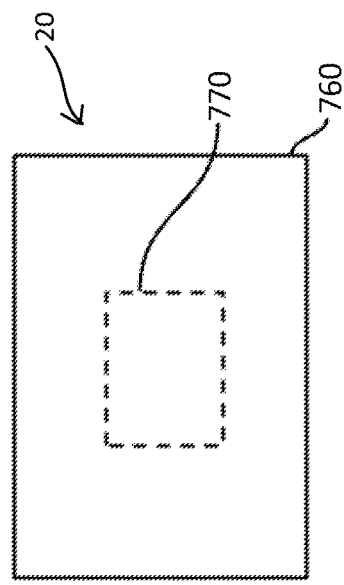

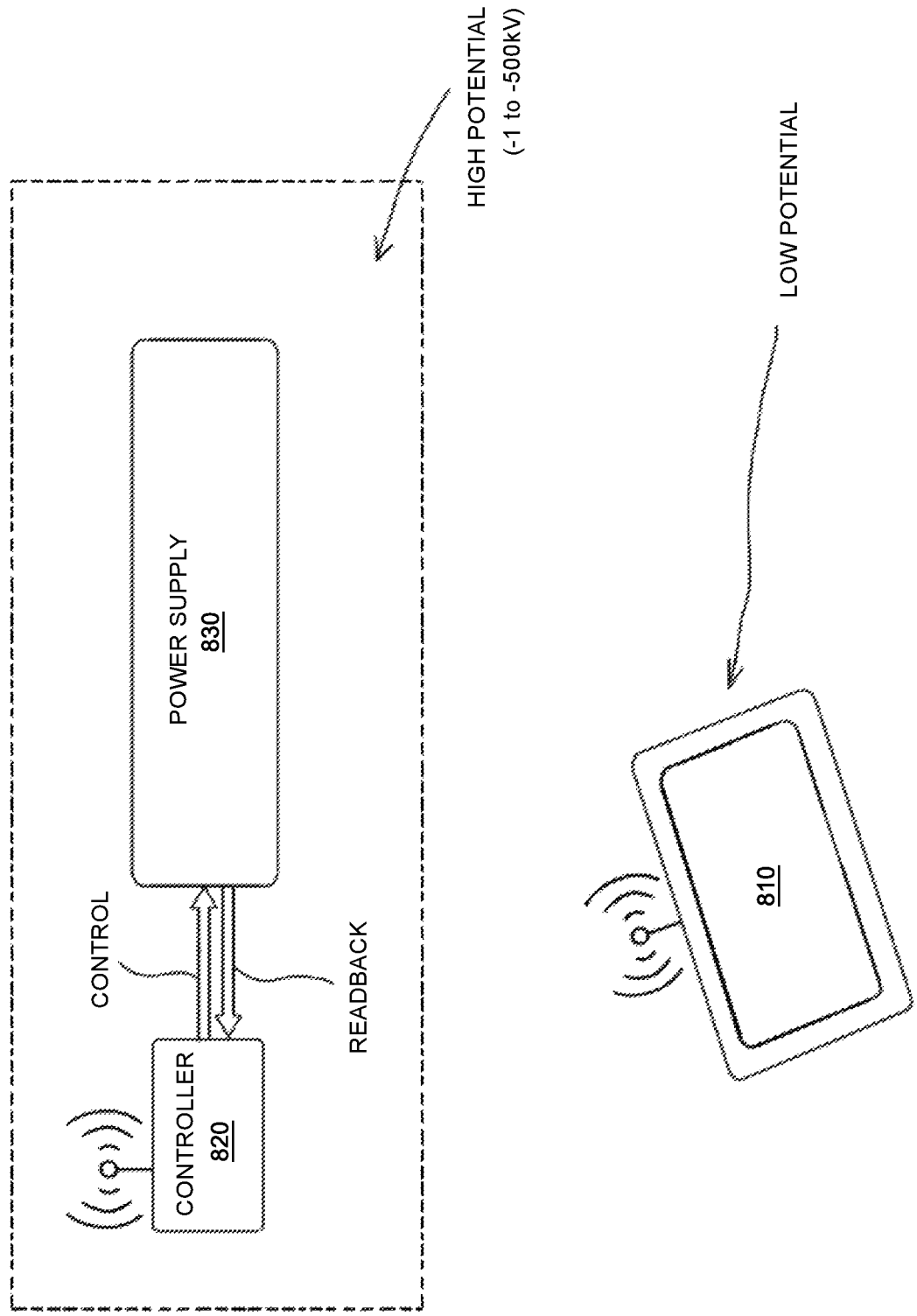

US 10,847,343 B1

MICROSCOPY

CLAIM FOR PRIORITY

This application is a continuation of U.S. patent application Ser. No. 15/426,024, filed Feb. 6, 2017, and issued as U.S. Pat. No. 9,899,186, which is a continuation of U.S. patent application Ser. No. 14/742,697, filed Jun. 17, 2015, and issued as U.S. Pat. No. 9,564,291, which claims priority under 35 U.S.C. § 119(e) to Provisional Application 62/013,514, filed Jun. 17, 2014, and is a continuation-in-part of U.S. patent application Ser. No. 14/607,079, filed Jan. 28, 2015, which claims priority under 35 U.S.C. § 119(e) to Provisional Application No. 61/932,159, filed Jan. 27, 2014, all of which are incorporated herein by reference in their entireties.

TECHNICAL FIELD

This application relates to improvements in microscopy.

BACKGROUND

Microscopy, which includes charged-particle beam microscopy and light microscopy, can be used to image samples at very small dimensions. For example, charged-particle beam microscopy, which includes electron microscopy and focused ion beam microscopy, can be used to investigate samples at dimensions smaller than what is possible using solely light microscopy. Charged-particle beam microscopy may also reveal information that is not readily available through light microscopy, such as in relation to composition, crystallography, and topography of the sample.

However, conventional charged-particle microscopes typically have a number of practical disadvantages compared to light microscopes. Conventional charged-particle microscopes are usually cumbersome to maintain and repair. For example, replacing worn or damaged internal components of a microscope may require specialized knowledge and extreme care so as not to contaminate the normally evacuated space within the microscope or damage the sensitive componentry.

Moreover, microscopes may be complicated to operate, requiring extensive training. In addition, microscopes may be expensive and require the human operator who wants to image a sample to be present at the microscope or at a single user terminal that is locally connected to the microscope. Popular access to the benefits of certain types of microscopy has therefore been severely limited.

Thus, it is desirable to provide microscopy that is reliable and permits relatively easy maintenance and repair. It is also desirable for a microscope to be relatively accessible and easy to use without extensive training.

SUMMARY

In one embodiment, a charged-particle beam microscope is provided for imaging a sample. The microscope comprises a vacuum chamber to maintain a low-pressure environment and a stage to hold a sample in the vacuum chamber. The microscope further comprises a charged-particle beam source to generate a charged-particle beam and charged-particle beam optics to converge the charged-particle beam onto the sample. A detector is provided to detect charged-particle radiation emanating from the sample. The microscope additionally comprises a controller to analyze the detected charged-particle radiation to generate an image of the sample. A power supply comprising a battery is provided to power at least the charged-particle beam optics and the controller.

In another embodiment, a charged-particle beam microscope system is provided for imaging a sample. The system comprises a charged-particle beam microscope comprising a vacuum chamber to maintain a low-pressure environment, a stage to hold a sample in the vacuum chamber, a charged-particle beam source to generate a charged-particle beam, charged-particle beam optics to converge the charged-particle beam onto the sample, a detector to detect charged-particle radiation emanating from the sample, and a controller to analyze the detected charged-particle radiation to generate an image of the sample. A computer is provided outside from the microscope to be in wireless communication with the controller of the microscope, and the charged-particle beam microscope is adapted to be maintained at a negative electrical potential relative to the computer.

It is to be understood that both the foregoing general description and the following detailed description are exemplary and explanatory only and are not restrictive of the invention as claimed.

BRIEF DESCRIPTION OF THE DRAWINGS

The accompanying drawings, which are incorporated in and constitute a part of this specification, illustrate several embodiments and aspects of the transmission electron microscopes described herein and, together with the description, serve to explain the principles of the invention.

FIGS. 4A, 4B, 4C, and 4D are schematic diagrams of examples of embodiments of detectors arranged on mounted platforms.

FIG. 8A is a schematic top view of a multi-accessory printed circuit board (PCB).

FIG. 8B is a cross-sectional side view of Section A-A shown in FIG. 8A.

FIG. 8C is a schematic top view of one of the regular-type connectors shown in FIG. 8A.

FIG. 12A is a schematic side view of an example of an embodiment of a hybrid SLM-SEM.

FIG. 12B is a schematic side view of an example of another embodiment of a hybrid SLM-SEM.

FIG. 12C is a schematic side view of an example of an embodiment of a laser module of a scanning light module.

FIG. 12D is a schematic side view of an example of an embodiment of respective fields of view of a scanning light module and a charged-particle beam microscope.

FIG. 15 is a schematic diagram of an example of an embodiment of a system for electrically-isolated wireless communications between a user interface (UI) and a microscope.

DETAILED DESCRIPTION

A microscope—such as a charged-particle beam microscope, light microscope, atomic force microscope, or scanning tunneling microscope—may be adapted and used advantageously to image and examine samples. A charged-particle beam microscope may be, for example, an electron microscope (EM) or focused ion beam (FIB) microscope. An EM may comprise, for example, a scanning electron microscope (SEM), scanning transmission electron microscope (STEM), or transmission electron microscope (TEM). The microscope may illuminate the sample with one or more beams (such as charged-particle beams or light beams) and detect radiation from the sample to generate an image of the sample. A SEM or STEM, for example, scans an electron beam that is formed into a probe across the sample. A light microscope may be, in one version, a confocal microscope that illuminates the sample with a light beam and observes reflected light. One example of a confocal microscope is described in U.S. Pat. No. 5,161,053 to Dabbs, which is incorporated herein by reference in its entirety. The images may be evaluated, such as by a human user of the microscope, to identify characteristics of the sample.

Figure 1:
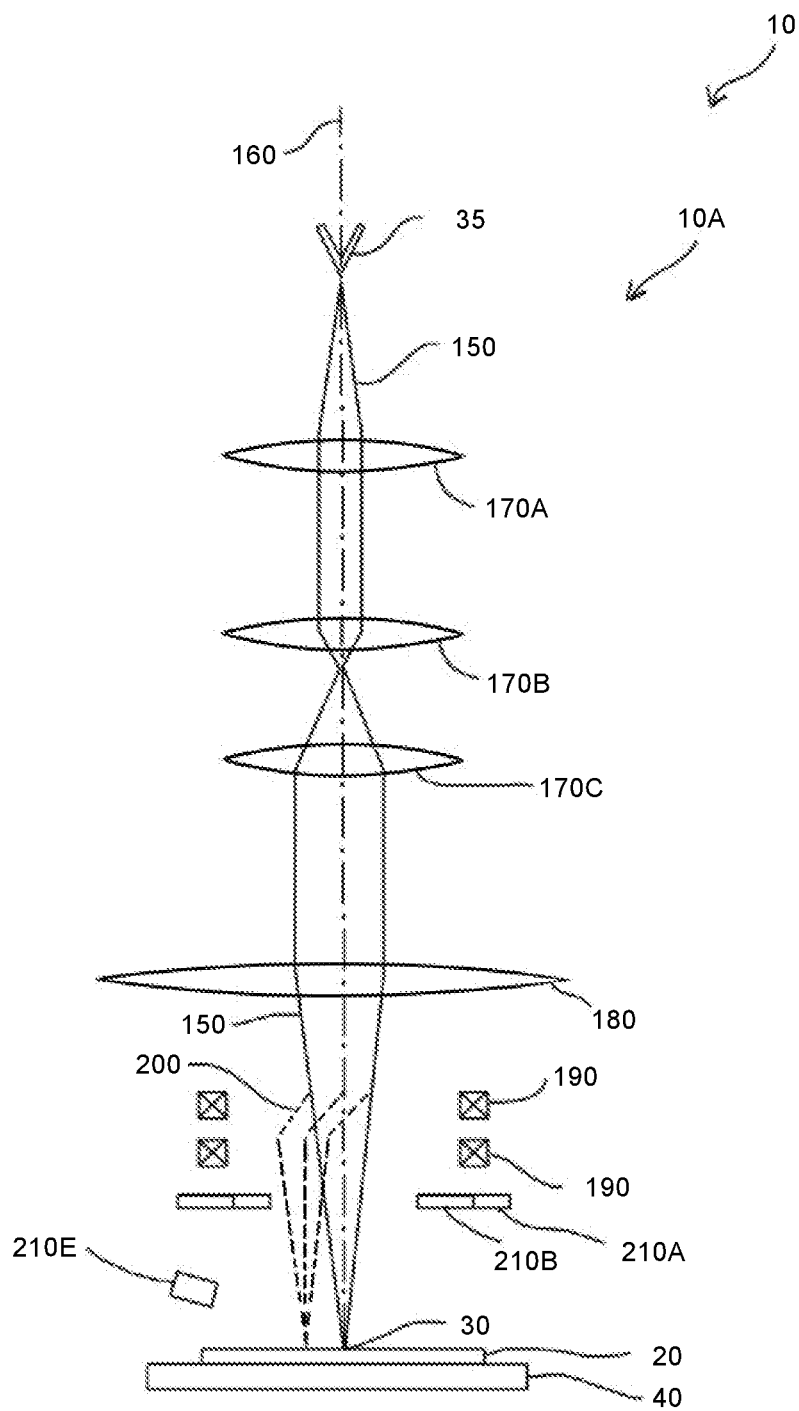
FIG. 1 is a schematic diagram of an example of an embodiment of a scanning electron microscope (SEM).

FIG. 1 is a schematic diagram of an example of an embodiment of a microscope 10 that is a SEM 10A, provided for the sake of illustration. SEM 10A has a housing that, when closed, is substantially airtight and defines a chamber with an enclosed volume therein. A sample 20 can be placed inside SEM 10A, such that an area that can be exposed to an electron beam probe 30 for imaging. Sample 20 may include and be supported, for example, by a substrate (not shown). Sample 20 may be of any quantity, may be of any suitable shape or size, and may include any desired features. For example, sample 20 may include a specific configuration for a desired application or parameter setting. In another embodiment, discussed in further detail below, sample 20 is a reference (or "test") sample used for testing or optimization purposes, such as containing gold nanoparticles. The substrate that can be used to support sample 20 may include a layer of crystalline or amorphous carbon. Single-atomic-layer graphene may also be used. Alternatively or in addition, the substrate may include boron nitride, silicon, silicon dioxide, aluminum, polymeric resins, or organic materials.

SEM 10A may have a stage 40 to support and move sample 20 within SEM 10A. In one version, stage 40 is adapted to be moved continuously while the charged-particle beam is simultaneously scanned. This may improve throughput by allowing continuous acquisition of images while eliminating the settling time caused by stop-start motion of a stage that is moved discretely and that may prevent acquisition of a still image of the sample.

For example, stage 40 may be a piezoelectric stage. The piezoelectric stage may have a piezoelectric motor that is capable of moving the stage very quickly and smoothly so that short exposures on the order of milliseconds or microseconds can be practically achieved. The piezoelectric stage may also be adapted to move the stage with very high positional precision. In one embodiment, the stage motor is capable of displacing the sample at a speed of at least about 100 nm per second.

Figure 2A:
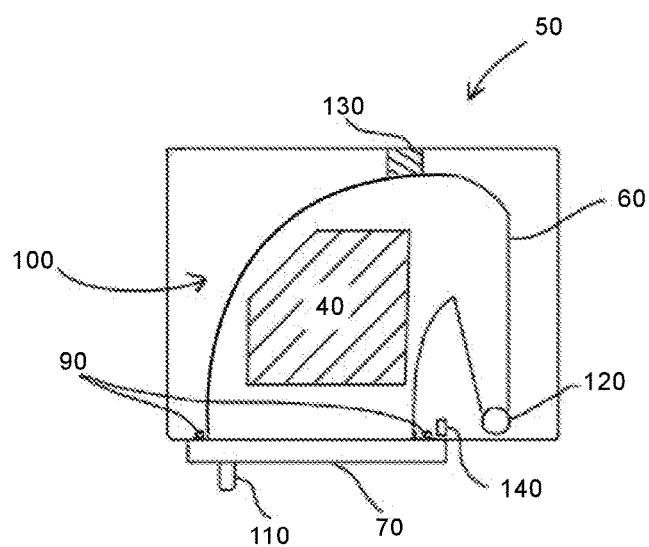
FIGS. 2A, 2B, and 2C are schematic diagrams of an example of an embodiment of a stage mechanism for a microscope.
Figure 2B:
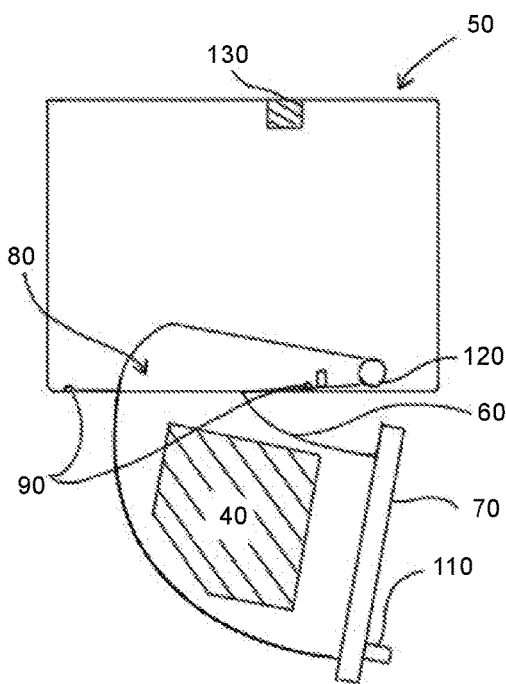
Figure 2C:
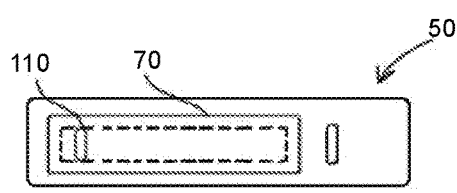
Figure 3A:
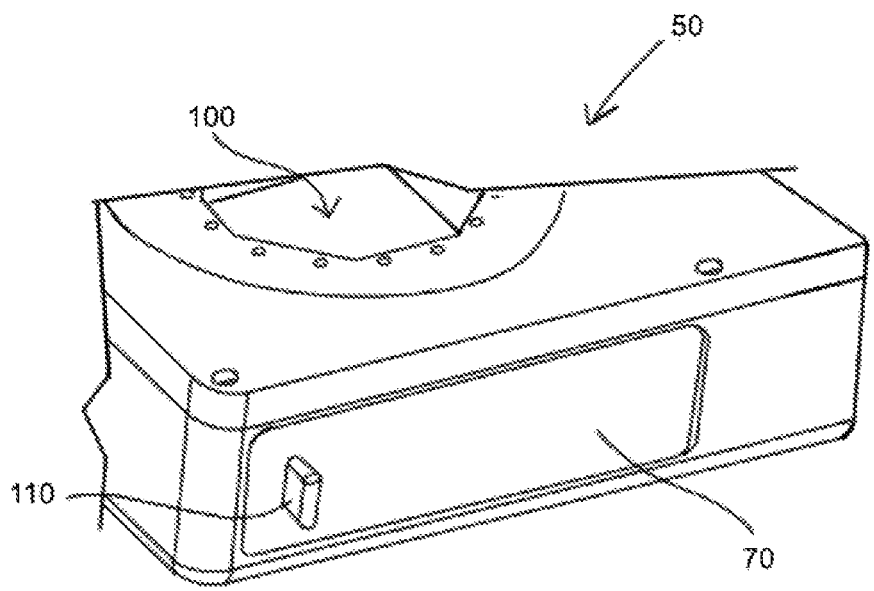
FIGS. 3A and 3B are three-dimensional rendered perspective views of the example of the embodiment of stage mechanism illustrated in FIGS. 2A, 2B, and 2C.
Figure 3B:
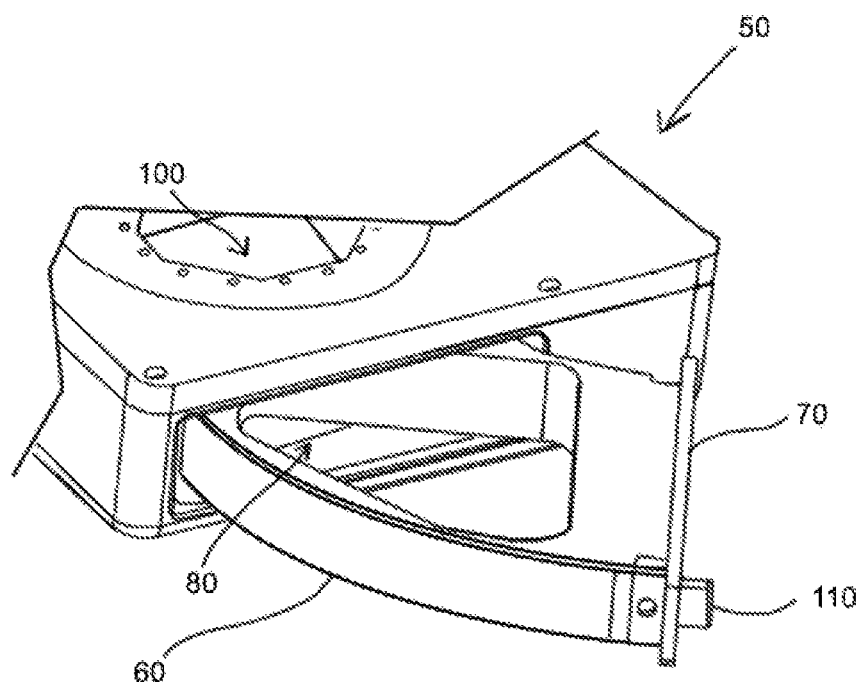

In one version, a stage mechanism is provided that includes an arced tray adapted to rotate about a hinge with stage 40. Previously described stage 40, including motors to move stage 40, may be mounted in the tray of this stage mechanism. FIGS. 2A, 2B, and 2C are schematic diagrams of an example of an embodiment of such a stage mechanism 50—a top transparent view in which tray 60 is closed, a top transparent view in which tray 60 is open, and a front view in which tray 60 is closed, respectively. FIGS. 3A and 3B are three-dimensional rendered perspective views of this example of the embodiment of stage mechanism 50, with tray 60 in closed and opened states, respectively.

This version of stage mechanism 50 may provide several advantages over conventional microscope stages, which typically have a tray mounted on a linear roller. First, the rotating mechanism of this version enables easy access to stage 40 for loading and unloading. Rotating tray 60, as it is being opened, moves a door 70 out of the way of the user, presenting the unobstructed side of stage 40 to the user and thereby enabling easy access to sample 20 on stage 40. Unlike some conventional door mechanisms, door 70 does not squarely face the user and thereby obscure visibility of sample 20. The height of sample 20 can also be observed easily during opening and closing of door 70, reducing the chances that the user's valuable sample 20 is damaged by impact of sample 20 against sample chamber opening 80. A collision with sample 20 could not only damage user's valuable sample 20, but it could also contaminate a seal 90 on sample chamber 100 around chamber opening 80 and contaminate the column with fractured pieces of sample 20. In this embodiment, however, stage mechanism 50 provides increased visibility of sample 20 by the user.

Second, relatively few mechanical parts may be needed to efficiently transition stage 40 between sample chamber 100 and the outside environment. The rotary motion of tray 60 can permit less linear displacement of sample 20 than the concurrent displacement of handle 110 of tray 60 when tray 60 is being opened or closed. This may permit the user greater sensitivity in observing and manipulating the position of sample as door 70 is being opened or closed.

Moreover, a hinge 120 can be equipped with easy-to-machine cylindrical parts that enable damping and predefined resting positions of door 70 in open, closed, and in-between states, respectively. This also contributes to a sensitive treatment of sample 20.

Third, stage mechanism 50 may have greater reliability than conventional methods and systems for inserting samples into and removing samples from stage 40. Interconnections to and from stage 40, such as wiring harnesses, are subject to rotational stresses, which can result in greater lifetime than linear stresses. Furthermore, hinges 120 may be more compact and less sensitive to dust and particles than linear rails.

Fourth, stage mechanism 50 may provide easy accessibility and servicing of stage 40. For example, stage 40 can be a drop-in module that is rapidly exchanged or repaired without opening the microscope housing. Once closed, strategically placed dampers, such as damper 130 shown in FIGS. 2A and 2B, may be placed in kinematic contact with tray 60, such as by attachment to tray 60. This, combined with seal 90 and hinge 120, which can both be configured with damping properties, can serve to stabilize tray 60 to substantially remove mechanical instability in order to permit stable imaging by microscope 10 at high resolution.

In addition, stage mechanism 50 may be communicatively coupled to a controller of microscope 10. For example, a door closure sensor 140, which may be placed internally or on the face of door 70, may automatically notify the controller of microscope 10 when door 70 has been closed and microscope 10 is ready to pump down to vacuum. In another embodiment, the door closure sensor 140 is integrated with handle 110, which may be configured with a ready switch to notify the controller of readiness for pumpdown. Handle 110 may be configured to toggle or rotate to deliver on or off signal states.

Returning to FIG. 1, SEM 10A further includes an electron beam source 35 to generate an electron beam 150. Electron beam source 35 may be adapted to generate an electron beam having a current of less than about 100 mA. For example, for many applications electron beam source 35 may generate a beam current of from about 10 picoamps to about 1 milliamp. In an especially low-current version, however, electron beam source 35 may be adapted to generate electron beam 150 to have a current of less than about 10 µA, such as less than about 10 pA. Electron beam source 35 may have a filament (e.g., tungsten filament) through which current is passed to generate electrons and a Wehnelt to channel the electrons into a beam. Further, electron beam source 35 may have an accelerating aperture to accelerate the electron beam away from electron beam source 35.

SEM 10A has an optical system through which electron beam 150 travels from source 35 to sample 20, and optionally through which electron beam 150 travels after it has been transmitted through sample 20. The optical system may define an optic axis 160 along which electron beam 150 travels. The optical system may include illumination optics. The illumination optics may include condenser lenses 170A-C to form electron beam 150 into a collimated probe 30 that illuminates sample 20. Condenser lenses 170A-C may consist of, for example, two, three (as shown in the figure), or four lenses. Condenser lenses 170A-C may be magnetic or electrostatic.

The optical system of SEM 10A may also include an objective lens 180 to focus electron beam 150. An objective aperture may be provided in the back focal plane of objective lens 100 or a plane conjugate to the back focal plane to define an acceptance angle, referring to an angle of electron beam 150 that is transmitted through the aperture and allowed to illuminate sample 20. The rays that objective lens 100 focuses to probe 30 on sample 20 are thus limited in angle by the aperture.

One or more beam scanners 190 may be provided to scan electron beam 150 across sample 20. FIG. 1 shows an example of a scanned beam 200 at a second position. Beam scanners 190 may scan electron beam 150 by generating either a magnetic or an electric field. For example, beam scanners 190 may include scan coils that generate an alternating magnetic field. Alternatively, beam scanners 190 may use electrostatic deflectors to scan electron beam 150. Beam scanners 190 may be provided in pairs, such as two or four paired electromagnetic coils or electrostatic deflectors. Beam scanners 190 can be excited with ramp waveforms, causing the collimated probe to be scanned across the sample and thereby producing an intensity signal at the detector unique to the location of the probe on the sample. FIG. 1 shows an example of electron beam 150 being scanned between a first position and a second position 200.

In one version, beam scanners 190 are adapted to provide a larger field of view compared to conventional charged-particle beam microscopes. For example, beam scanners 190 may include double-rocking scan coils, coils with a greater turns ratio, or higher-power (i.e., higher-current) scan coils. Alternatively or in addition to scan coils, beam scanners 190 may include electrostatic deflectors that can slew greater voltages, such as voltages greater than about 15 V. These embodiments can increase the size of the field of view of the microscope. Large field-of-view beam scanners such as those described above may advantageously be used in combination with a long-working-distance optical column to enhance the efficacy of the optical column by enabling larger areas to be surveyed in one image without translation of the sample or multiple images being taken and later montaged.

When sample 20 is illuminated by electron beam 150, electrons interact with sample 20, producing radiation that emerges from the sample surface in a pattern that is collected by one or more detectors 210A, 210B. Detectors 210A, 210B may detect radiation that can include one or more of backscattered electrons, secondary electrons, auger electrons, cathodoluminescence, ionized gas, and x-rays, and generate a corresponding signal.

The electron-beam energy used in SEM 10A may be selected at least in part based on the target resolution, the transmission properties of sample 20, and the energy of the detected radiation. The penetration depth of the beam into sample 20 may be selected to permit the escape and detection of interaction radiation from sample 20. The penetration depth may be selected to be, for example, from about 1 nanometer to several micrometers, such as, for example, a penetration depth on the order of 2 nanometers, to result in a range of sensitivities to surface or subsurface structure.

If electrons of electron beam are reflected or deflected from sample 20, they are considered scattered. For example, electrons scattered back toward the electron-beam source are referred to as backscattered. In one example, backscattered electrons can be successfully detected if they have an energy of at least about 2 keV. As a result, electrons having an energy of from about 2 keV to about 3 keV may have the lowest beam energy appropriate to permit detection of backscatter electrons in this example, unless a backscatter detector of low-energy type is used, in which case back-scattered electrons with energies of less than about 1 keV may be detected. Secondary electrons, on the other hand, are produced by secondary processes at sample 20 and may possess far lower energies of, for example, from a few Volts to a few hundred Volts. Thus, the detection of secondary electrons may be compatible with lower beam energies. Lower beam energies have advantages in certain problem spaces, which may include being less destructive to samples, less deeply penetrating (i.e., more surface-sensitive), and requiring lower-cost equipment to generate and stabilize the accelerating potential.

Detectors 210A, 210B may detect charged particles, such as scattered electron beams, emerging from sample 20 at one or more angles. Each of detectors 210A, 210B may comprise, for example, a scintillator and a photosensitive detector. The photosensitive detector may be, for example, a charge-coupled device (CCD). The scintillator produces photons when impacted by charged particles. The photosensitive detector receives that light and outputs a corresponding electrical signal.

The intensity and/or angle of scattered electrons may vary according to the atomic number (Z) of atoms in sample 20. For example, a greater number of electrons may be backscattered and produce a higher-intensity signal at detectors 210A, 210B when atoms of higher atomic number are illuminated. In one embodiment, atoms of sample 20 having higher atomic number scatter electrons to higher angles, while lighter atoms scatter electrons to lower angles, revealing information about the composition of sample 20.

Detectors that are photosensitive may be provided to detect light-emitting phenomena such as cathodoluminescence or fluorescence. These may be the same detectors as or different detectors than the charged-particle-sensitive detectors such as detectors 210A, 210B. For example, a charged-particle-sensitive detector that is made of a scintillator and a photosensitive detector may have a scintillator that is substantially optically transparent, such that photons pass through the scintillator and are detected by the same photosensitive detector.

A photosensitive detector of microscope 10 may even be adapted to be sensitive to particular preselected wavelengths. For example, an array of multiple detectors with varying spectral sensitivity may be provided. Photons within a tight spectral window may be detected by a silicon photomultiplier (SiPM) that amplifies their signal into an electrical signal. Alternatively, a multi-spectrum or broad spectrum SiPM may detect these photons such that photons of multiple preselected wavelengths within a wider range may be detected simultaneously.

In one version, charged-particle-sensitive detectors are configured in one or more concentric annular rings and a central circular disc detector in an approximately cylindrically symmetric detector arrangement to receive the electrons (as shown in FIG. 1). There may be apertures between detectors 210A, 210B. For each range of angles, detectors 210A, 210B may provide an intensity signal corresponding to current received for that angular range. If the detector is a CCD, the scattered beams may form an image of a diffraction pattern or channeling pattern of sample 20.

Alternatively to concentric, on-axis detectors, the detectors may have a shape that is cylindrically asymmetric. For example, the detectors may be segmented or configured as area detectors that are arranged off-axis. In other embodiments, the detectors have an inner or outer perimeter that is polygonal, such as square or hexagonal, or another suitable shape.

In one version, a detector-shifting mechanism is provided to move one or more of the detectors in situ during acquisition of an image or between acquisitions of images. The mechanism may have detector mounted on it and may have an actuator that moves the detector in response to an input signal. This may enable selective detection of the backscatter signal in azimuthal or radial dimensions, for example. By varying detector position, the apparent direction of the "light" source of the image is controlled. Additionally, the angle of detected backscatter signal, which may have an intensity distribution that is a function of atomic number in the sample, may be controlled.

In one embodiment, a miniature detector, for example a silicon photomultiplier (SiPM), is mounted on a rotating platform. FIG. 4A is a schematic diagram of an example of this embodiment. A mechanical mount 220 holds a rotating platform 230, such as by an arm 240 between them. Rotating platform 230 supports at least one detector 190A. This permits selective detection of the backscatter signal azimuthally. Rotating platform 230 may have an opening 250 in its center to allow transmission of beam 150 therethrough. FIG. 4B is a schematic diagram of a side view of detector 210A and beam 150.

FIG. 4C is a schematic diagram of another example of this embodiment. In this example, an array of multiple detectors 210A is mounted in a substantially circularly symmetric pattern on platform 230. Platform 230 may have opening 250 in its center to allow transmission of beam 150 therethrough.

In another embodiment, detectors may be arranged in a substantially circularly asymmetric pattern. FIG. 4D is a schematic diagram of an example of such an embodiment. In this example, detectors 210A are arranged in an arc pattern. Platform 230 may have opening 250 at the beam axis to allow transmission of beam 150 therethrough. Mechanical mount 220 may have a telescoping arm 240 that can move platform 230 toward or away from mount 220, such as by another, separately controlled actuator.

SEM 10A may be adapted to operate in a "low-angle" backscatter mode in which a detector, such as detector 190B, detects a "low-angle-scattered" electrons emerging from specimen 20. This low-angle mode may be particularly sensitive to light elements in the sample, differentiating from heavier elements and indicating chemical composition.

Alternatively to the low-angle backscatter mode, SEM 10A may be adapted to operate in a high-angle backscatter mode in which one or more electron beams emerging from sample 20 within a particular angular range are detected. Since sample 20 is illuminated at approximately a point, this angular range of detection can be tightly controlled. For example, the high-angle backscatter mode may be a high-angle mode in which an electron beam shaped as a hollow cone of preselected thickness is detected. The high-angle backscatter mode may involve detecting a hollow cone at higher angles, which is referred to as high-angle backscatter mode. The dark-field mode may also be a medium-angle backscatter mode, in which a range of angles between the low-angle mode and high-angle mode are detected. These dark-field modes can produce an image with monotonic contrast change with increasing atomic number, which enables direct interpretability of the image to determine relative atomic weights. For example, high-angle backscatter imaging can be used to obtain chemically sensitive images of clusters of molecules, atoms, or nanostructures. An electron beam source having a high-brightness gun may allow this mode to operate faster.

Additional signals, such as secondary electrons and x-rays produced by the interaction between electron probe 30 and sample 20, may also be simultaneously detected in the region near the sample by one or more detectors, such as a detector 210E.

Figure 5:
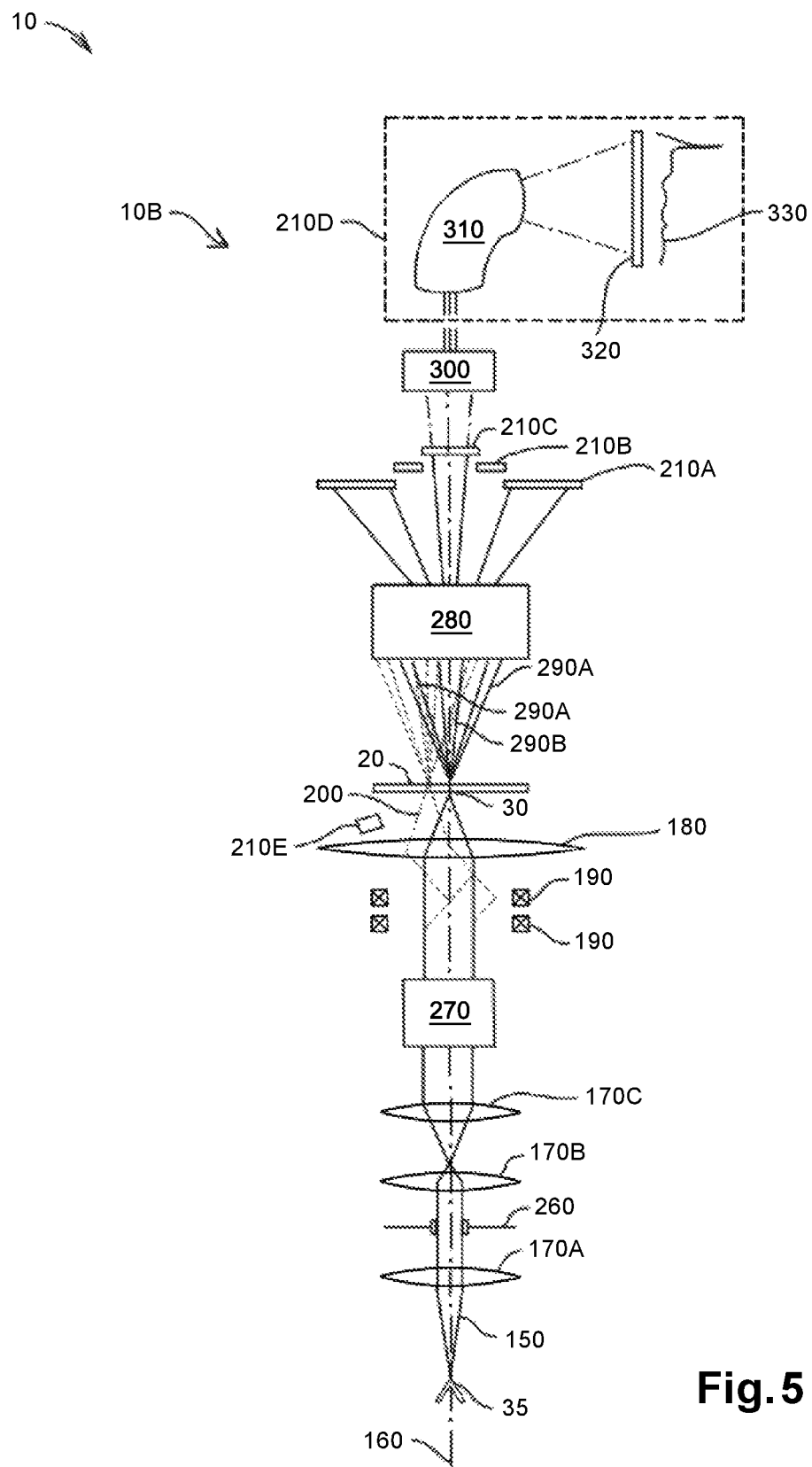
FIG. 5 is a schematic diagram of an exemplary embodiment of a scanning transmission electron microscope (STEM).

FIG. 5 is a schematic diagram of another exemplary embodiment of microscope 10, which in this case is a STEM 10B, provided for the sake of illustration. In the STEM mode, the scattered beam is at least partially transmitted through sample 20 and this portion is therefore considered forward scattered. STEM 10B, like SEM 10A, may have a stage (not shown), electron beam source 35, illumination optics 170A, 170B, 170C, aperture 260, objective lens 100, beam scanners 190, and detectors 210A-C, 210E.

In order to improve speed, accuracy, and sensitivity, STEM 10B may have a dedicated aberration corrector 270 to correct for aberrations in electron beam 150, such as spherical aberrations and parasitic aberrations. The parasitic aberrations may or may not be cylindrically symmetric. Aberration corrector 270 may include electromagnetic lenses to correct for these aberrations. Parasitic aberrations may be caused, for example, by the optical elements having been machined in such a way as to be very slightly off-axis or very slightly non-round. Examples of commercially available aberration correctors include Nion Co. quadrupole-octupole correctors (available from Nion Company of Kirkland, Wash.) and CEOS sextupole or quadrupole-octupole correctors (available from Corrected Electron Optical Systems GmbH of Heidelberg, Germany).

The optical system of STEM 10B may also include descanning and projection optics 280. The descanning optics may de-scan scattered electron beams 290A, 290B, thus, for example, realigning beam 290B with optic axis 160. The descanning optics may comprise, for example, descanning coils that may be symmetric to scan coils of beam scanners 190. The projection optics may include magnifying lenses that allow additional manipulation of scattered electron beams 290A, 290B.

The electron beam energy used in STEM 10B may be determined at least in part based on the transmission properties of sample 20. A substrate of sample 20 may have a thickness on the order of 2 nanometers, such as for example a thickness of about 1 nanometer. In one example, the substrate is made of carbon, although single-atomic-layer graphene may also be used. As a result, 1 keV electrons may be the lowest energy appropriate when considering voltage alone.

STEM 10B may be adapted to operate in a "bright field" mode in which a detector, such as detector 210C, detects a "forward-scattered" or "central" beam 290B of electrons emerging from specimen 20. Forward-scattered beam 290B refers to the zero beam (i.e., the 0 scattering vector, referring to the beam whose direction is identical to the orientation of beam 150 impinging on specimen 20) and a small range of angles around the zero beam. The bright-field mode may be particularly sensitive to the energy loss of the electrons, indicating chemical composition. These electrons can be detected to determine, for example, bonding energies of molecules that compose the sample.

Alternative to the bright-field mode, STEM 10B may be adapted to operate in a dark-field mode in which one or more electron beams 290A emerging from sample 20 within a particular angular range are detected. Since sample 20 is illuminated at approximately a point, this angular range of detection can be tightly controlled. For example, the dark-field mode may be an annular-dark-field (ADF) mode in which an electron beam shaped as a hollow cone of preselected thickness is detected. The dark-field mode may involve detecting a hollow cone at higher angles, which is referred to as high-angle annular-dark-field (HAADF) mode. The dark-field mode may also be a medium-angle dark-field (MADF) mode, in which a range of angles between the bright-field mode and the HAADF mode are detected. These dark-field modes can produce an image with monotonic contrast change with increasing atomic number, which enables direct interpretability of the image to determine relative atomic weights. For example, dark-field imaging can be used to obtain chemically sensitive projections of single atoms, clusters of atoms, or nanostructures. STEM 10B can also operate in simultaneous bright-field and dark-field modes. An electron beam source having a high-brightness gun may allow this mode to operate faster.

In one version, STEM 10B may have a detector 210D adapted to detect electrons in one or more preselected range of energies. Coupling optics 300 may be provided and detector 210D may include an electron prism 310 to filter out electrons that are not in the preselected energy ranges. In one version, this is used for electron energy loss spectroscopy (EELS). Electron prism 310 may, for example, generate an electric or magnetic field by using electrostatic or magnetic means, respectively. The field strength and dimensions of electron prism 310 may be selected such that, when the electrons of varying energies pass through the field, the electrons in the preselected energy range are transmitted through electron prism 310 while the remaining electrons are blocked. Detector 210D may also include a receiver 320, such as including a scintillator and CCD, to receive the transmitted electrons and convert that current into a detection signal. The EELS detection signal can be expressed as a plot 330 of current as a function of electron energy loss.

Furthermore, optics having a larger acceptance angle may improve resolution of STEM 10B. Because of this relationship between the acceptance angle and resolution of STEM 10B, the acceptance angle can be selected based on the desired resolution. For example, in a high-resolution STEM, if 1 Angstrom resolution at 100 kilovolts is desired, it may be desirable to have at least about 30 milliradians acceptance half-angle, or even at least about 40 milliradians acceptance half-angle. However, with an angular range that is unnecessarily high, current may be wasted undesirably. Once a suitable accelerating voltage is chosen, the desired resolution may determine the acceptance angle of objective lens 180.

Moreover, detectors 210A-E from SEM and STEM embodiments, such as, for example, from FIGS. 1 and 5, respectively, may be provided concurrently in one embodiment of microscope 10. These may be provided, for example, to operate microscope 10 in simultaneous SEM and STEM modes or to allow relatively quick and easy switching between SEM and STEM modes.

The geometry of one or more of detectors 210A-C may be adapted to distinguish low-angle scattering from high-angle scattering in both forward and backscattering configurations to make contrast in the image depend on atomic number (Z). Detectors 210A-C may be located on the same side of sample 20 as electron beam source 35 or opposite to it. For example, in a STEM mode, detector 210A may be provided to operate in a HAADF mode in which high-angle electron beam 210A is detected, detector 210B may operate in a MADF mode, and detector 210C may operate in a bright-field mode in which axial electron beam 210B including a zero beam is detected.

Each of detectors 210A, 210B, if arranged in a substantially cylindrically symmetric geometry, may limit the scattered electrons to an angular range denoted here as yd, which defines an annulus between an inner angle $\varphi_1$ and outer angle $\varphi_2$. For an ADF mode these angles may be, for example, from about 25 mrad to about 60 mrad for $\varphi_1$, and from about 60 mrad to about 80 mrad for $\varphi_2$. For a STEM HAADF mode using detector 210A, these angles may be, for example, from about 60 mrad to about 80 mrad for $\varphi_1$, and greater than about 100 mrad for $\varphi_2$.

Figure 6:
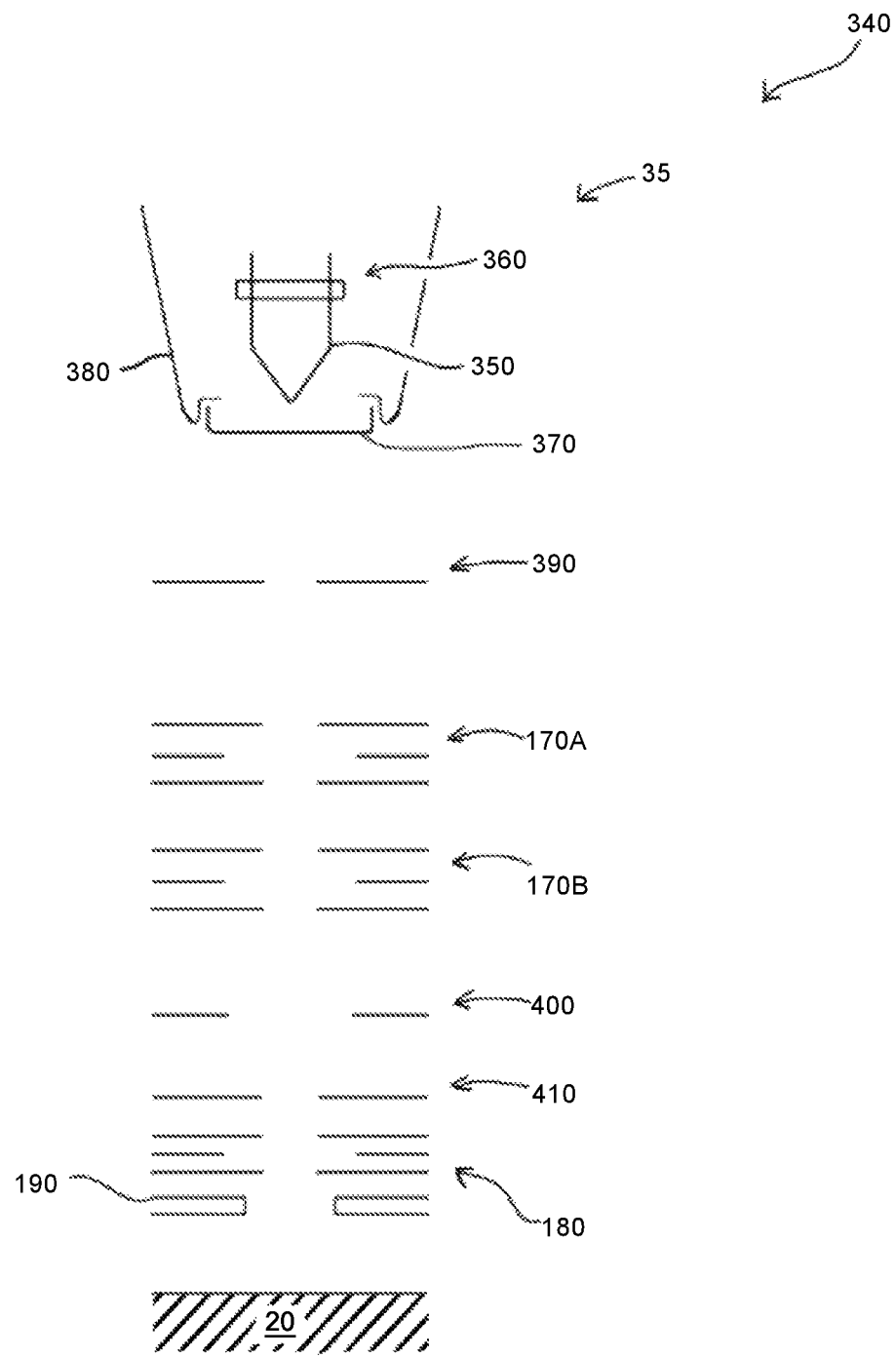
FIG. 6 is a schematic side view of an example of an embodiment of an optical column for a charged-particle beam microscope.

The optical system of a beam-optical microscope (i.e., charged-particle beam microscope or light microscope) may be referred to as the optical "column." FIG. 6 is a schematic side view of another example of an embodiment of an optical column 340 for a charged-particle beam microscope. If scanning coils are included, optical column 340 may be the optical column of, for example, a scanning electron microscope (SEM). Alternatively, optical column 340 may be used on the source side of a transmission electron microscope (TEM).

This column 340 includes a charged-particle beam source 35 (e.g., electron or ion beam source), which has a gun 350 that provides charged particles at a predefined voltage. The voltage may be in the range of from about 1 kV to about 100 kV, with polarity as needed to propel the ions down the column. Source 35 may include a centering mechanism 360, such as, for example, adjustable screws or a motor that is either manually or computer controlled. Source 35 may also have a Wehnelt 370 to provide focusing of the particles as they leave the source. Wehnelt 370 may be set at a voltage close to the particle source voltage and either attractive or repulsive to the particles. For example, the voltage may be set in the range of from about −10 V to about −1000 V and repellant to the charged particles. Source 35 may be surrounded by an insulator 380.

Column 340 may also include a first anode 390, which may be held at ground or other voltage more positive than the beam source 35, to which the particles are attracted. First anode 390 may have a hole in its center (or elsewhere) through which a portion of the charged particles passes. Further downstream, column 340 may also include a number of condenser lenses 170A, 170B or other electron-optical elements to adjust the beam before objective lens (OL) 180. These may be configured in any suitable order or combination. Column 340 may also have stigmators 400. There may also be a final aperture (objective aperture) 410 before OL 180. Finally there is OL 180, followed by sample 20.

Optionally there may be additional components between OL 180 and sample 20, such as stigmators or electrical shifters. The column design in this example is adapted for simplicity. For example, the lenses may not be alignable and there is only one aperture (i.e., the objective aperture) in the whole column (although the bores of condenser lenses 170A, 170B may act to obstruct some of the beam).

The charged-particle optical column may have individual lenses with interconnections at each lens, such as for power, water cooling, and/or sensing. However, such a column may be relatively difficult and expensive to manufacture, align, and service. For example, each lens may have to be independently aligned to its neighboring lenses and the axis of the column. If there is a malfunction, the electrical connections in the stack of components of the column that are above the malfunction and potentially others below it may have to be disconnected and the entire optical column opened up in order to provide service.

Thus, it may be advantageous to integrate a number of, or all of, the optical components, electrical contacts, and vacuum couplings of the optical column into a monolithic column that is designed to remain as an integrated unit rather than to be capable of being disassembled into parts. The monolithic column may also be manufactured relatively inexpensively. For example, layers of the monolith may be stacked or fabricated as a single piece and then the monolith may be machined as a unit to fabricate the monolithic column. The monolithic column may be substantially shaped as, for example, a compact tube. Alternatively, the monolithic column may be shaped to provide advantageous connection of optical components, electrical contacts, or vacuum couplings.

Such a monolithic column may provide a number of advantages compared to other columns. First, the interconnections may be provided in a relatively simple configuration and the number of interconnections can be reduced. In one example, all signal communications between the monolithic column and the rest of the microscope may be provided through a single interconnection at a mechanical mounting point of the monolithic column at which the column is mounted to the housing of the microscope.

The monolithic column may also be able to be manufactured relatively inexpensively. Thus, the monolithic column can be adapted to be replaced easily, such that a failure of the column due to, for example, contamination of the optics in the column, component failure, or expiry of consumable parts such as a filament, can be addressed efficiently and relatively inexpensively.

The optical components within the monolithic column may be designed to have low drift (both mechanically and electrically). This can permit the column to be stored and operated in a wide variety of temperatures and conditions. This is achievable using low temperature coefficient materials, or making use of combination materials, and/or special geometries that take advantage of symmetries with error-canceling properties to compensate for the effects of thermal expansion.

The mechanical spacing of the optics in conjunction with fixed lens settings enables monolithic columns to have purpose-built illumination modes (and also projector modes in TEM). Variations of the monolithic column can provide different working distances or illuminations, for example high current or high resolution illumination modes in a single low-cost column that is easily switched out.

In the case of electrostatic optics being used in the monolithic column, a single supply can be used to define both the accelerating potential as well as other potentials such as lens potentials by means of dividers, thereby enabling a fixed-focus or limited-focus microscope column that has very few parts end-to-end, using only a single power supply and very simple mechanical construction.

Electrostatic optical components may enhance imaging or observation of magnetic samples. This is in addition to the advantage of being able to use a single supply to power all lens elements. Trim lenses may be used for as "fine" focusing to modify the "coarse" focus of the primary lenses such as the objective lens. The coarse focus lens may have a fixed focus. Alternatively, the column may be operated as a fixed-focus lens, where focusing is performed by altering the position of the sample relative to the optical components of the column.

An electrostatic trim lens can also be used within the system to provide fine focusing. Because it offers trim, it may be operated at one to two orders of magnitude lower potential than the primary lens potentials. This trim lens may take the form of a single aperture with a potential applied, or may be a more formal lens such as a full Einzel lens that is weakly excited.

A variation of the above-described embodiment uses one or more magnetic lenses. In practice, magnetic lenses may have from about two to about three times lower spherical aberration and about five times lower chromatic aberration than electrostatic lenses, so increased resolution can be obtainable by using a magnetic lens instead of an electrostatic lens. Similarly, this could be done with one more of the condenser lenses, as the chromatic aberration is additive throughout the system. A potential drawback of using magnetic lenses, however, despite potentially increased resolution, is increased bulk, power consumption, and corresponding heat dissipation. Nevertheless, the size and strength of such a magnetic lens may be adjusted to substantially balance out these effects.

For example, a fixed magnetic objective lens may be provided. Furthermore, a magnetic trim lens may be provided to adjust the focus of the objective lens. The magnetic trim lens can operate with low voltages and low excitations to conserve power while providing fine focusing capability.

The optical column may be constructed as a module that is enclosed and adapted to be inserted and locked into the microscope enclosure and removed therefrom by a human user. The microscope housing may complementarily be adapted to receive the column module. Both the column module and the microscope housing may be adapted to permit signal communication between the column module and other components of the microscope when the column module is locked into the microscope.

The column module may contain components of a charged-particle optical column, such as but not limited to the charged-particle beam source. Optical elements, such as lenses, shape the beam as it propagates through the column. The components may also include, for example, an accelerating aperture (such as a first anode), a stigmator, beam scanners to scan the beam, and detectors. Sidewalls of the enclosure may be made of an electrical insulator in one embodiment. The top of the enclosure, meanwhile, may be metal.

The column module may be substantially sealed from an environment external to the column. For example, when evacuated, the column module may maintain a significant pressure difference between the volume inside the column module and the external environment. The internal volume and the external environment may even have different species of gases or liquid.

The column module may have a feedthrough that allows electrical signals to be conducted through enclosure and into the column module, such that signals may be applied to the components inside the column module. For example, electric potentials may be applied, through the feedthrough, independently to the gun of the charged-particle beam source and the optical components. The feedthrough may have electrical leads with exposed electrical contacts that couple to electrical contacts of the microscope housing when the column module is inserted and locked into microscope 10. As an alternative to electrical signals, the feedthrough may be adapted to convey optical signals, such as through optical fibers embedded in the feedthrough.

It may therefore be advantageous to separate the volumes using various volume separators. For example, the volume separator may be a suitably thin beam-transmission membrane. A thin gas-impermeable membrane may be substantially transparent to the charged particle beam, while maintaining the difference in pressure and substantially eliminating the gas jet.

The column module may have an emission window positioned after the final component contained within the volume inside enclosure. The emission window may be substantially opaque to gas particles while simultaneously being substantially transparent to the accelerated particles. To achieve these properties, emission window may be fabricated to be very thin while having high strength. For example, the emission window may be fabricated of silicon nitride (SiN). The portion of the emission window that is substantially transparent to particles may be small in diameter to enhance its strength. The emission window may be connected through a medium-to-high electrical resistance path to the enclosure so as to bleed off excess charge from passing charged particles, while not substantially diminishing the current of the charged-particle beam. Electrostatic lens elements, which may comprise disc-shaped elements having apertures along the beam path, may be used to structurally support the emission window. This may substantially avoid introducing additional structural elements for mechanically supporting the emission window and therefore avoid structural complexity.

Certain optical components, such as components that are very near sample 20 during imaging, for example the beam scanners, may be placed after the emission window and therefore outside of the enclosure, but may still be part of the sealed column module. Placing such components after the emission window may allow larger deflections than might otherwise be possible due to the limited diameter of the emission window. Alternatively, such optical components may be placed before the emission window and therefore inside of the enclosure.

In one version, the emission window is energized with an electric potential to place a charge on axis of the beam. This charge on axis may be selected to alter aberrations or to correct deleterious aberrations from other parts of the optical system, thereby improving the resolution performance of microscope 10.

Alternatively or in addition, the volume separators may be apertures. These apertures may be referred to as differential gas flow apertures. These apertures may be, for example, 0.5 mm aperture inserts, or 1 mm apertures which form electrodes of lenses. Differential gas pressure would typically cause a jet of gas particles traveling from the volume with higher pressure toward the volume with lower pressure, and such a gas jet can exacerbate beam scattering locally until the beam passes substantially through the jet. These apertures, however, can limit the gas flow between volumes, due to their small size, and thereby mitigate such gas flows to suitable levels.

The charged-particle beam need not necessarily travel through the centers of the gas flow apertures, or through the apertures at all. Any of the apertures, for example, may be auxiliary to and placed apart from a separate and smaller aperture that is provided for the beam path.

In the case of a tungsten filament, the overall differential pressure ratio between the inner volume of the column module and the external environment may be, for example, from about 10 to about $1 \times 10^{10}$, such as about $1 \times 10^2$. The inner volume of the column may also have substantially different gaseous composition. For example, the inner volume may have a relative absence of water vapor or reactive elements in relation to the external environment. Alternatively, the inner volume may have a gaseous or liquid leak that provides replenishing, healing, or restorative elements to the optical elements in the inner volume, such as to the filament area.

A sealed module containing a charged-particle gun system may be sealingly enclosed such that a pressure difference between different, or even identical, species of gases or liquid can be maintained between an inner gun volume and the external environment. In the case of a tungsten filament, the overall differential pressure ratio may be 10 to $1 \times 10^5$, with a nominal value of $1 \times 10^2$. The inner volume may have a substantially different composition, for example, substantial absence of water vapor and reactive elements, in contrast to the external environment.

In order to reach pressures of less than about $1 \times 10^{-2}$ Torr in a particular volume, a turbo-molecular pump, or molecular drag pump, diffusion pump, or other suitable high-vacuum pump, may be used for that volume, in addition to a roughing pump. In order to reach pressures at least as low as about 1 Torr in a particular volume, meanwhile, only a roughing pump (e.g., diaphragm pump, scroll pump, or rotary vane pump) may be used.

Figure 7A:
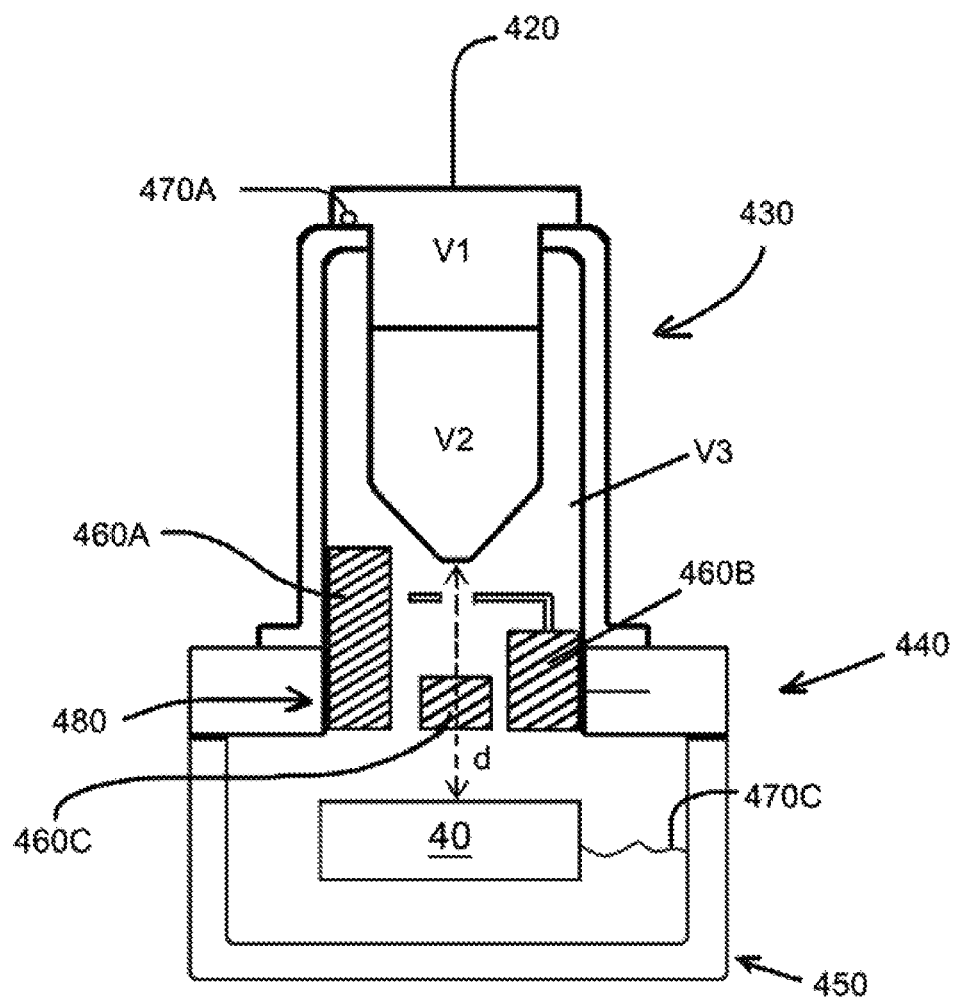
FIG. 7A is a schematic side view of an example of an embodiment of a modular microscope.

A modular microscope system may comprise several modules that are easily interchangeable and replaceable. FIG. 7A is a schematic side view of an example of an embodiment of such a modular microscope. In this example, the modular microscope include a column module 420, column mount 430, accessory mount 440, microscope base or stage mount 450, accessory modules 460A, 460B, 460C, and stage 40.

In this embodiment, the optical column may be split into two vacuum volumes V1 and V2, and the sample chamber encloses a third vacuum volume V3. Differential pumping enables separation of the vacuum volumes V1-V3, where pressures are related as V1<V2<V3. The V1 volume and V2 volume may represent the same volume and pressure in some versions.

Differential pumping enables smaller pumps to be used with the microscope, as only one strong pump may be needed for volume V1 and the remaining volumes may be pumped through apertures, or separately by weaker pumps.

The column module 420, accessory modules 460A, 460B, 460C, and stage mount 450 may be quickly and efficiently exchanged for other modules. This for example allows columns of different types to be swapped out—for example, charged-particle columns of varying types (e.g., high current, large or small working distance, high resolution), or even light-optical columns. Column module 420 may have a feedthrough 470A to provide communication across the vacuum barrier.

Figure 7B:
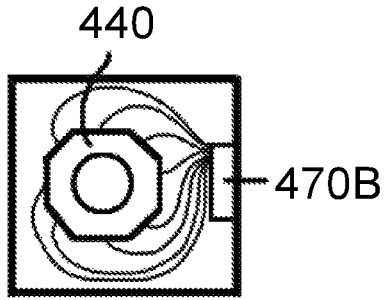
FIG. 7B is a schematic diagram of a top view of an accessory mount of a modular microscope.

Accessory mount 440 separates column mount 430 from stage 40. Within accessory mount 440, an array of connection points 480 surrounding the column perimeter allows attachment of varying accessory devices. These devices may provide mechanical, electrical, and physical (i.e., gaseous) inputs/outputs. These inputs and outputs may be standardized, and are collected together and efficiently connected to the outside world via a single or small number of feedthroughs 470C. FIG. 7B is a schematic diagram of a top view of an accessory mount 440 having feedthrough 470B.

Figure 7C:
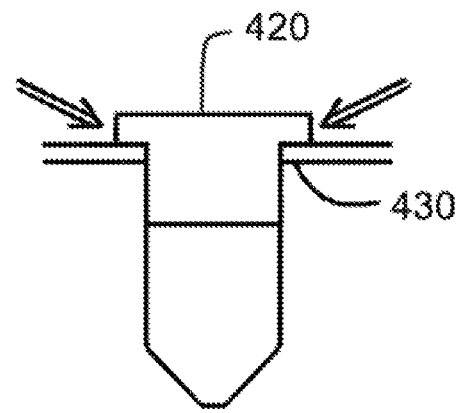
FIG. 7C is a schematic side view of an example of an embodiment of a column module inserted in a column mount of a modular microscope.

The coupling between column module 420 and column mount 430 may be implemented as a bayonet or other quick-release mechanism, permitting the mechanical, electrical, and gas connections to be made substantially simultaneously in a single quick movement. FIG. 7C is a schematic diagram of a side view of an example of one embodiment of column module 420 inserted into column mount 430. This enables fast exchange of column module 420 from column mount 430.

FIG. 8A is a schematic top view of a multi-accessory printed circuit board (PCB) 490 that has eight (8) standardized connection points (also referred to as "accessory bays"). For example, the regular-type connector (bays 0-6) 500A may include a high-density quick-release low and medium voltage connector, whereas the high-current/high-voltage type connector (bay 7) 500B may include a lower density array of connectors that are able to support higher currents or voltages than the high density ones. In this figure, two of the connectors (bays 0 and 4) are shown as populated with accessory modules 460D, 460E while the other bays are empty.

FIG. 8B is a cross-sectional side view of Section A-A in FIG. 8A. This figure shows PCB 490 is mounted on a frame of accessory mount 440. A screw 510 holds accessory module 460D in the bay and electrical connector 520 to connect accessory module 460D to PCB 490. FIG. 8C is a schematic top view of one of the regular-type connectors 500A shown in FIG. 8A, showing electrical connector 520 and screw hole 530.

Figure 9A:
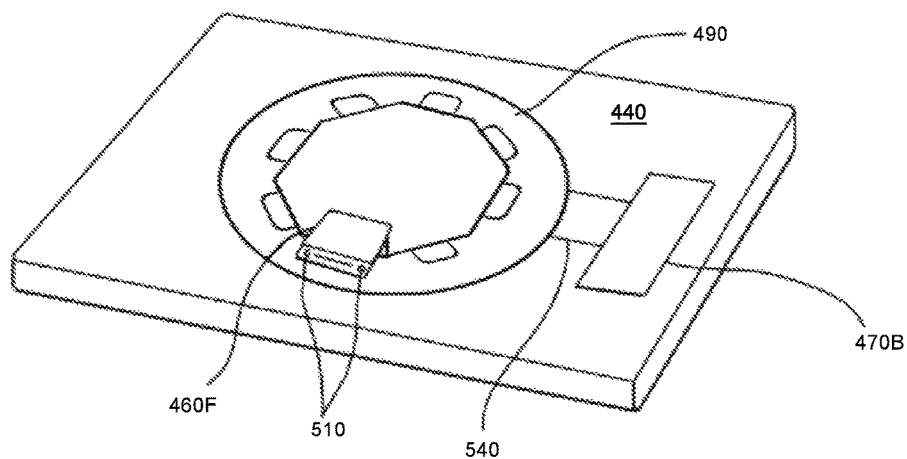
FIG. 9A is a schematic perspective view of the PCB shown in FIG. 8A.
Figure 9B:
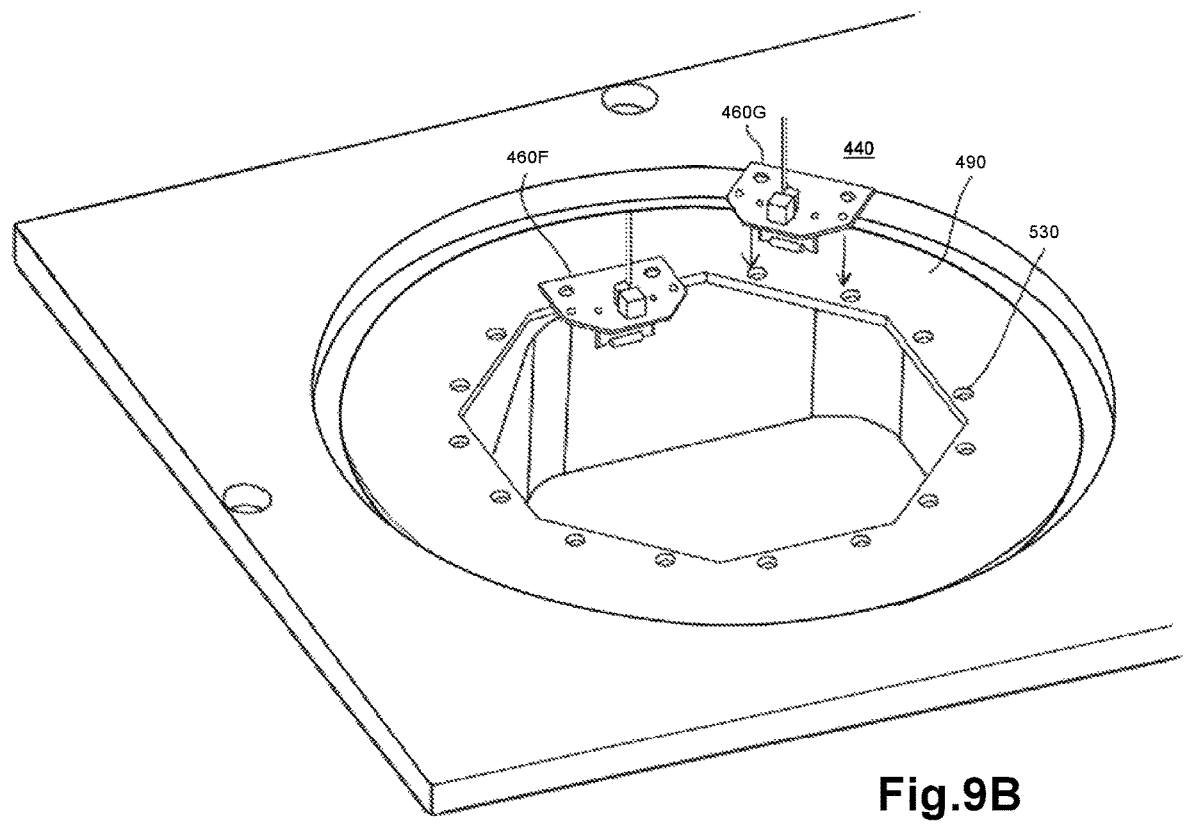
FIG. 9B is a three-dimensional rendered perspective view of the PCB shown in FIG. 9A.

FIG. 9A is a schematic perspective view of PCB 490 shown in FIG. 8A. PCB 490 may be connected to feedthrough 470B through a wiring harness 540. FIG. 9B is a three-dimensional rendered perspective view of PCB 490 shown in FIG. 9A.

Such a modular microscope may provide several advantages. First, the modular microscope clearly defines interfaces between subsystems such that core component and accessory structure interconnections are standardized. Second, the sample volume is well-defined and does not substantially interact with optical system or accessories. Third, electrical interfaces and feedthroughs may be simple, optimized, and constrained, while affording ample expansion opportunities and variation of installed subsystems.

Additional optical components, such as lenses, stigmators, deflectors, beam splitters, and prisms may be implemented as respective modules to augment the functioning of the system. Such elements may allow for capabilities such as beam blanking, interferometry, holography, and other types of unique measurements by affecting the beam shape or geometry just above the sample.

Microscope 10 may additionally contain a compact evaporator to prepare the sample by evaporating metal or another contrast-enhancing agent such that the evaporant deposits onto the surface of the sample. The compact evaporator can be a component of microscope 10, and, when placed together with sample 20 inside the chamber of microscope 10, can evaporate the contrast-enhancing agent onto the sample in situ.

Figure 10A:
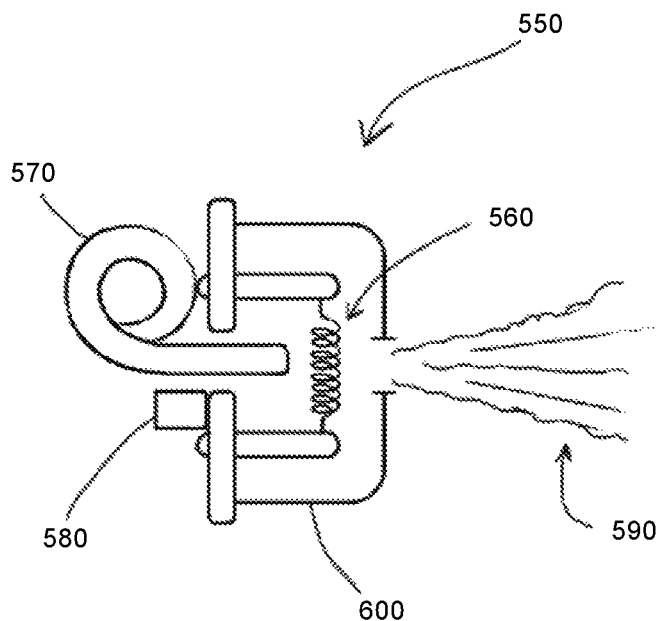
FIG. 10A is a schematic side view of an example of an embodiment of a compact evaporator.

FIG. 10A is a schematic side view of an example of an embodiment of a compact evaporator 550. Evaporator 550 may have a heated filament 560 and a reservoir of evaporant wire 570. Evaporant wire 570 may be in spool or rod form, for example. A motor system 580 may advance evaporant wire 570 onto heated filament 560, whereupon heated filament 560 melts wire 570 and wicks it into filament 560, from which the wire material is evaporated (as evaporant 590 shown in the figure). Evaporator 550 may also have a shield 600 to prevent over-spray of evaporant 590 and to direct evaporant 590 onto the sample. Shield 600 may have an aperture cowl over filament 560 to achieve this. Further, evaporator shield 600 may protect the detectors from the spray of evaporant, which could otherwise become coated with evaporated material; this can enable live detection of sample 20 and monitoring of the evaporation and deposition process. A human user may thus be able to monitor and throttle evaporator 550 so as to select the amount of evaporant 590 that is to coat sample 20.

Figure 10B:
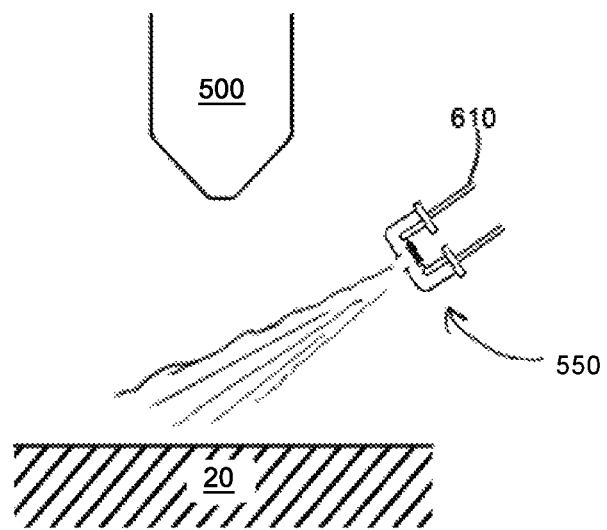
FIG. 10B is a schematic side view of an embodiment in which a compact evaporator is located inside the chamber of a microscope.

Evaporator 550 may be compact and enclosed in a small form factor, making it suitable for installation inside sample chamber 100 of microscope 10. For example, evaporator 550 may have a form factor of from about 1×1×1 cm to about 3×3×3 cm in size, such as about 2×2×2 cm in size in one example. FIG. 10B is a schematic side view of an embodiment in which evaporator 550 is located inside the chamber of a microscope, at a location that is vertically between column 340 and sample 20. This figure also shows that evaporator 440 may have electrical terminals 610 to receive power from a power supply.

Figure 11A:
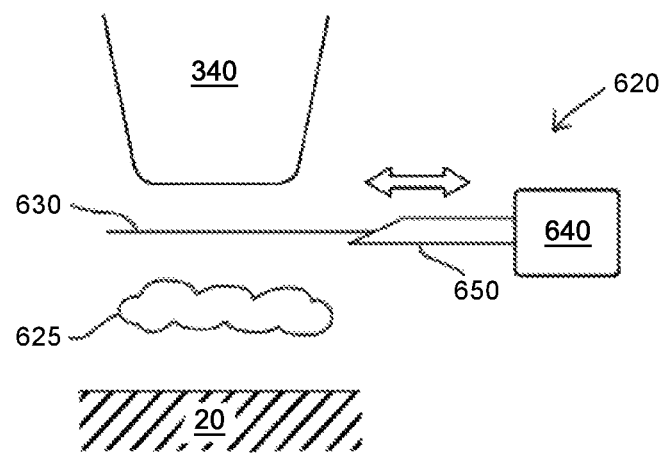
FIG. 11A is a schematic side view of an example of an embodiment of a protective screen module in a microscope to protect the microscope from a process occurring near the sample.
Figure 11B:
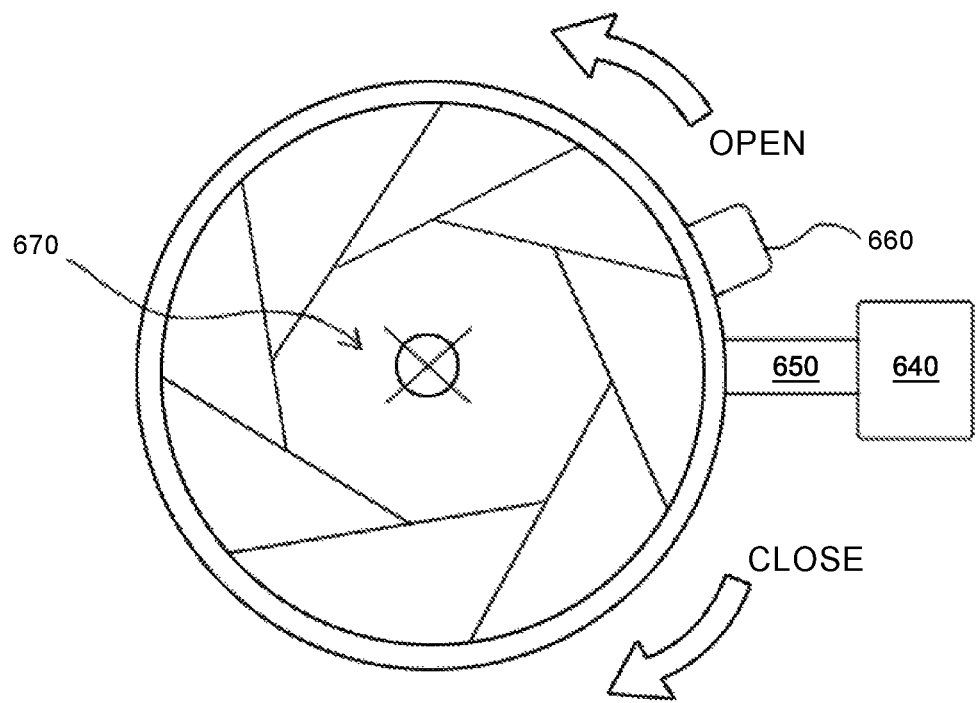
FIG. 11B is a schematic top view of an example of an embodiment of a protective screen module.

Microscope 10 may also have a protective screen module to shield the column from a process, such as a reactive etch, sputtering, or evaporative deposition, that the user may want to shield the sensitive column from. FIG. 11A is a schematic side view of an example of an embodiment of a protective screen module 620 in microscope 10 to protect from a process 625. A screen 630 may be attached to, and extend from, a mechanical mount 640 by an arm 650. For example, screen 630 may be a solid sheet that can be introduced and retracted mechanically. Alternatively, screen 630 may be an adjustable aperture mechanism, which may be opened by rotating a ring. FIG. 11B is a schematic top view of an example of this type of assembly, where the "X" marks a possible location for the beam to pass through the opened aperture assembly. When a motor 660 is actuated, rotating the exterior ring, aperture 670 closes thereby shielding the column from the process.

Furthermore, a scanning light microscope (SLM) module may be provided inside microscope 10, SLM module being communicatively coupled to controller 10 to provide a hybrid scanning light and charged-particle beam microscope that has novel and synergistic features.

The SLM may include a laser module with optics to produce a small focused spot on a sample. A scanning module that contains scanning elements, such as mirrors that tilt in multiple axes, positions the beam spot on sample 20. The beam is scanned in a pattern on sample 20, and a detector detects the signal produced by the interaction of the beam with the sample. This signal may include reflected light or a fluorescent signal.

In a combination scanning light and charged-particle microscope, both types of scanning microscopes are included in a single system. For both scanning microscope types, the distance of the focused spot from the final optical focusing element is referred to as the "working distance." The system may be light-insulated from the external environment so as to avoid detection of stray light from the environment. It may also, but not necessarily, be enclosed in a vacuum to prevent scattering of charged particles by gas molecules or ions. The SLM module may also detect reflected color by using filtered detectors or different colored laser beams.

Advantages include that one scanning system and one detector system can be shared between both optical systems. Furthermore, the hybrid microscope can provide disparate fields of view: (1) a scanned light field of view, which may be a larger field of view that allows a high-speed survey at lower magnification and lower resolution, and (2) a scanned charged-particle field of view, which may be a smaller field of view that allows higher magnification and higher resolution. The hybrid microscope may also permit colocalization of light-optical and charged-particle signals, from the same sample, optionally at the same time. For example color information at low resolution from the scanning light microscope could be combined with high resolution contrast (grayscale) or energy-resolving information from the charged-particle microscope.

Further, sample 20 may be tagged (or "labeled") with compounds (also referred to as "tags" or "markers") that have affinity to certain types of structures, and upon excitation by a laser or electron beam the tag compound may fluoresce. As one example, a compound tag may be attached to a protein receptor on the surface of a cell. This fluorescence signal can enable identification and pinpointing of spatially fine structures by multiple scanned imaging modalities operating optimally at different length regimes. Sample 20 may be probed by both light and charged-particle optical systems in succession, or in parallel, so as to take advantage of the variety of signals that microscope 10 makes available in this combination.

In one version, microscope 10 is a scanning charged-particle beam microscope, such as, for example, a STEM or SEM. FIG. 12A is a schematic side view of an example of an embodiment of a hybrid SLM-SEM 680A. In this example, a scanning light microscope module 690 has a laser module 700 that is placed perpendicular to charged-particle column 340 of microscope 10. This allows it to be placed outside of the inner vacuum space of microscope 10, and coupled to vacuum space by a transparent window 710. Module 690 also includes optical elements 720 to direct and scan the laser beam onto sample 20.

In an alternative embodiment, shown in FIG. 12B, laser module 700 is placed parallel to charged-particle column 340, either to the side of (and within the vacuum space) or above column 340 (and outside the vacuum space). This enables a more compact arrangement and places the optics of scanning light microscope module 690 away from the region of sample 20, freeing up room for detectors and sample-treatment devices or other devices. Again, module 700 also includes optical elements 720 to direct and scan the laser beam onto sample 20. In FIG. 12B, hybrid SLM-SEM 680B also contains a compact evaporator 550.

FIG. 12C is a schematic side view of an example of an embodiment of laser module 700. In this example, laser module 700 has a laser source 730 and a lens 740 that generate a focused laser beam 750.

FIG. 12D is a schematic side view of an example of an embodiment of respective fields of view of SLM 690 and charged-particle beam portion of microscope 10, respectively, on sample 20. SLM 690 has larger field of view 760, while the charged-particle beam portion of microscope 10 has smaller field of view 770. This illustrates the potential advantageousness of the larger field of view 760 of SLM 690.

Figure 13A:
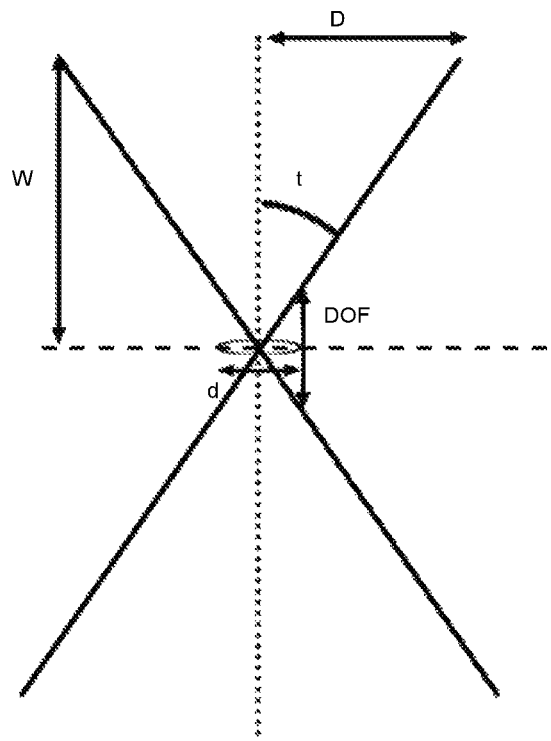
FIG. 13A is a schematic diagram of a light beam passing through a sample.

FIG. 13A is a schematic diagram of a light beam passing through a sample. 'D' is an aperture radius, 'W' is the distance from the aperture, and 't' is the numerical aperture. For small ratios of D/W, t≈D/W. In light optics, the diffraction limit diameter 'd'=1.22$\lambda$W/D. Then the depth of field DOF=d/t.

Figure 13B:
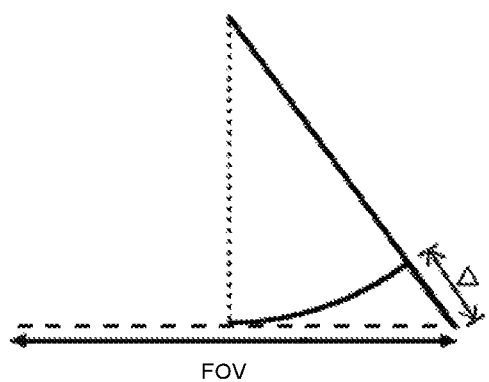
FIG. 13B is a schematic diagram of a light beam being scanned across a sample.

FIG. 13B is a schematic diagram of a light beam being scanned across a sample. The field of view 'FOV' is limited by the scanning angle. For example, certain examples of corresponding focal lengths, beam sizes, depths of focus, and maximum fields of view are provided in Table 1 below.

TABLE 1

| Focal length (mm) | 10 | 20 | 50 | 100 | 200 |
|---|---|---|---|---|---|
| Beam size ($\mu$m) | 5.2 | 10.4 | 25.9 | 51.8 | 103.6 |
| Depth of focus ($\mu$m) | 104 | 415 | 2,591 | 10,364 | 41,457 |
| Maximum field of view ($\mu$m) | 2,039 | 5,774 | 22,911 | 65,216 | 186,773 |

Charged-particle microscopes may have a charged-particle detection design in which charged particles emitted from the sample or some other source are detected by being converted to photons by a scintillator and then detected by a photon-sensitive detector (e.g., photomultiplier, pin diode, or CCD).

In general, electron microscopes use detectors that are only capable of directly measuring the intensity (or phase) of the electrons, and not their energy. This produces only a single value per pixel, i.e., a grayscale image (if energy of the electron was measured too, that could be used along with intensity to produce a color image). These grayscale images may be processed after acquisition to add color to certain areas (and not others) to enhance the visual appearance of the image. An exception is in backscatter detection, in which some energy filtering may occur in the detected signal by geometry, due to the relationship between scattering angle and composition in sample 20.

Alternatively, however, these same detectors may be used to detect photons directly. These photons could be reflected from the sample as a result of illumination by, e.g., a laser source. Thus, color images can be produced in a number of ways. One way would be to place colored filters in front of the detector and then combine signals from different colored filters to find the emitted color. Another embodiment may entail changing the color of the laser beam and not use filters in front of the detectors. A combination of both methods may also be used.

The detector may also be adapted to be tuned to be sensitive to a specific color or range of colors if such information is desirable. One useful application of this may be to provide color information to a grayscale charged-particle detected image. Generally the resolving power of focused light is lower than that of charged-particles, but this may be less of a problem for the color information than for intensity information. Combining color information from a photon sourced scanned image with a charged-particle image could provide high resolution (from the charged-particle image) combined with accurate color information.

It can therefore be possible to either collect both signals simultaneously or, alternatively, one after the other. The processing to produce a live image could be done in real-time or, alternatively, off-line.

Microscope 10 may include or be connected to a power supply that provides power to components of microscope 10. The power supply may include one or more individual power supplies, such as set to different voltages or otherwise taking different forms.

In a charged-particle beam microscope, the components that receive power from the power supply may include a charged-particle beam source (e.g., electron beam source 35), condenser lenses (e.g., condenser lenses 170A, 170B, 170C), the objective lens (e.g., objective lens 180), the detectors (e.g., detectors 210A-E), and the stage (e.g., stage 40). The power supply also provides power to the pumps of microscope 10, and to any other components of microscope 10 that consume power. In one embodiment of a charged-particle beam microscope, the optical system of microscope 10 has a total power consumption for all such components of less than about 2.5 kW. In another embodiment, designed for power efficiency, microscope 10 is a charged-particle beam microscope that has a total power consumption of less than about 1 kW. In yet another embodiment optimized for very high efficiency, microscope 10 is a charged-particle beam microscope that has a total power consumption of less than about 100 W.

In a charged-particle beam microscope, the power supply can provide one or more voltages to accelerate the charged-particle beam. In one version, the power supply includes at least one high-voltage supply, which may be used for a number of lenses. A single high-voltage supply that may be used to provide the primary beam energy can be modified with resistors to provide multiple values to different lenses that are at a ratio of the primary high-voltage value of the high-voltage supply. These resistors may be either constant or programmable by the controller. In this manner, instabilities that may be present in the high voltage signal can be provided substantially equally to the multiple lenses and the effects of the instabilities can be lessened. The power supply may also include one or more low-voltage supplies, such as may also provide lower voltages to non-round lenses, such as dipoles, quadrupoles, and octupoles.

An embodiment of microscope 10 that incorporates electrostatic lenses, fixed-magnet lenses, or hybrids thereof, in optical components, may be able to consume more than an order of magnitude less power than a conventional charged-particle microscope. Such a very-high-efficiency microscope may be capable of a total power consumption of less than about 100 W. An example of a very-high-efficiency electron microscope is the "Mochii" microscope available from Mochii, Inc., of Seattle, Wash.

Microscope 10 may have a battery power supply to provide power from one or more batteries that has intrinsically low noise (e.g., electrochemical cells natively have very low noise floor). This may provide certain advantages, especially for charged-particle beam microscope. For example, the battery power supply may reduce the physical size of the supply if the runtime requirement and additional weight from the battery bank are balanced. The battery power supply may be used to power subsystems, such as for example the filament of the charged-particle beam source, an accelerator, or lenses, or the entire microscope. The battery may include electrochemical cells (e.g., lithium-ion battery), electrochemical capacitors such as a supercapacitor, a fuel cell, one or more other suitable energy-storage modules, or any suitable combination of these. In one example, the battery power supply powers one or more subsystems or an entire microscope consuming less than about 275 W. In another example, a "Mochii" microscope that consumes less than about 200 W when fully energized, including all components (such as optical system, power supplies, pumping systems, controllers), is commercially available from Mochii, Inc. (d/b/a Voxa) of Seattle, Wash.

In one version, microscope 10 has a solar-power supply to generate electricity from ambient light. The solar-power supply may include, for example, one or more photovoltaic cells that are configured to receive ambient light. The photovoltaic cells may optionally be arranged in an array. In one embodiment, the solar-power supply works together with the battery power supply, such as including charging the battery power supply. The solar-power version may be especially suitable for a microscope that is optimized for very high power efficiency.

Since filament supplies in many applications, such as electron microscopy, are run at high negative voltage relative to the power source, which is typically at ground potential, a battery power supply can provide an efficient way to transfer power in a single transition event. Additionally, the battery power supply may enable the filament to be energized without the presence of AC in the filament supply line, eliminating frequency noise from the filament and improving performance in critical applications using minimal componentry.

Since conventional filament supplies of charged-particle beam microscopes are often run at large potentials relative to ground, the transformers that provide the power to these supplies must typically hold high voltages. The power to be transferred is often considerable (on the order of 5 W), and in many sensitive applications the AC outputted from the transformer must be converted to a very stable DC for the filament. As a result the transformers are typically large and bulky due to the need for large spark gaps, exotic potting materials, and large conductors. On the output end of the transformer, a precision regulated power supply—often of the inefficient linear type—is used to convert the outputted AC to DC for driving the filament. The transformers and AC to DC power supplies have native losses as power is transferred, which generates additional heat and less efficiency.

A solution to the drawbacks of conventional filament supplies of charged-particle beam microscopes is to use compact battery technologies to reduce the weight and size of such a supply by eliminating the need for a large spark gap power transformer and precision DC power supply regulation. The reduced parts count and bulk enable miniaturization and easier isolation. Power loss is reduced by eliminating the high voltage transformer and high precision and low noise DC producing circuitry that the filament requires, and using more efficient power supplies such as switching type to charge the battery. Charging of the battery can be performed by a charging supply that may not be stable enough or otherwise good enough to directly power a stably running filament in a conventional power supply of a charged-particle beam microscope. This can reduce cost, size, and weight.

In one version, the battery power supply is a multiple-battery bank power supply, such as a two-battery bank power supply. In this version, battery packs are used in tandem to allow one battery to be charged while the other is active in the system. Thus, continuous filament uptime can be achieved.

Figure 14A:
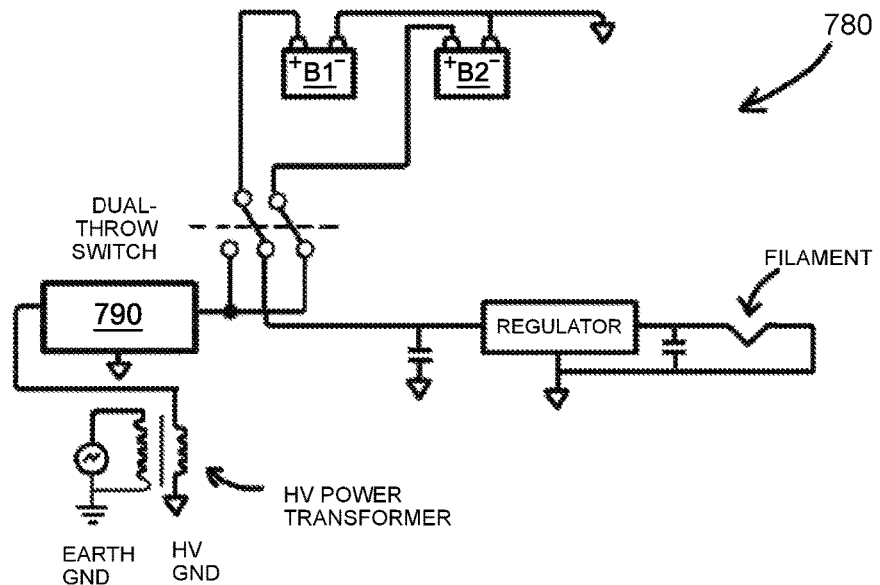
FIG. 14A is an electrical schematic diagram of an example of a first embodiment of two-battery bank power supply.

FIG. 14A is an electrical schematic diagram of an example of a first embodiment of a two-battery bank power supply 780. In this embodiment, two tandem batteries B1, B2 are used to provide DC power to the filament. Power supply 780 may have continuous runtime set by the capacity of batteries B1, B2 without requiring a charging supply 790 to be energized, and indefinite run time with charging supply 790 energized. Furthermore, batteries B1, B2 can be kept at high voltage. The DC from active battery B1 (connected to the filament) may be adjusted with a small regulator while inactive battery B2 (connected to the charging supply) is being charged. A transformer may supply a charge current to charging supply 790, which continuously charges inactive battery B2. When active battery B1 is depleted, freshly charged battery B2 is switched in to power the filament and the depleted battery is put into the charging mode.

Figure 14B:
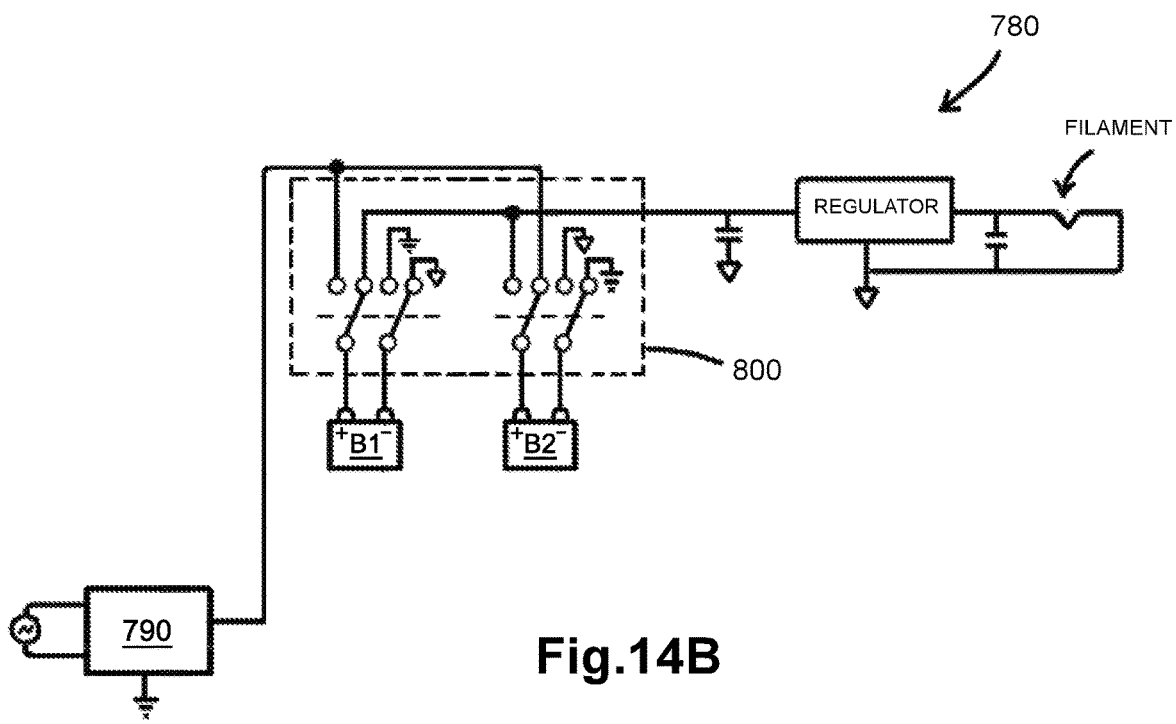
FIG. 14B is an electrical schematic diagram of an example of a second embodiment of two-battery bank power supply.

FIG. 14B is an electrical schematic diagram of an example of a second embodiment of two-battery bank power supply 780. This embodiment eliminates the 10 kV transformer as well as the AC-DC and replaces it with a charging supply 790 kept at low voltage. Batteries B1, B2 are able to be placed at either high voltage or at low voltage by a switching system 800 capable of maintaining the high voltage difference. Similar to the first embodiment, power supply 780 has continuous runtime set by the capacity of two batteries B1, B2 without charging supply 790 energized, and indefinite run time with charging supply 790 energized.

Microscope 10, which may be a charged-particle beam microscope or a light microscope, may include a controller to control various aspects of operation of microscope 10. The controller may, for example, receive inputs from a human user, provide instructions or other signals to components of microscope 10, and/or perform data processing of signals detected by microscope 10 to generate and process images. For example, the controller may control the components of the optical column of microscope 10, such as, in the case of a charged-particle beam microscope, the charged-particle beam source, beam scanners (e.g., beam scanners 170), and the detectors, as well as the stage. The controller may also receive signals from the detectors (such as detectors 190A-E) to be processed computationally to generate images. The controller may include an image formation unit for this purpose. The image formation unit may be disposed within or external to the microscope column and communicate with the optical system and the stage in any fashion, such as by a direct or indirect electronic coupling, or via a network. The controller may automatically handle one or more aspects of operation of microscope 10, and may even be adapted to substantially automate the operation of microscope 10 with minimal input required from a human user.

The controller may include one or more microprocessors, controllers, processing systems, and/or circuitry, such as any combination of hardware and/or software modules. For example, the controller may be implemented in any quantity of personal computers, such as IBM-compatible, Apple, Macintosh, Android, or other computer platforms. The controller may also include any commercially available operating system software, such as Windows, OS/2, Unix, or Linux, and any commercially available and/or custom software such as communications software or microscope monitoring software. Furthermore, the controller may include one or more types of input devices, such as for example a touchpad, keyboard, mouse, microphone, or voice recognition.

The controller software may be stored on a computer-readable medium, such as a magnetic, optical, magneto-optic, or flash medium, floppy diskettes, CD-ROM, DVD, or other memory devices, for use on stand-alone systems or systems connected by a network or other communications medium, and/or may be downloaded, such as in the form of carrier waves, or packets, to systems via a network or other communications medium.

Microscope 10, which may be a charged-particle beam microscope or light microscope, can be controlled using at least one terminal having a user interface (UI) that communicates with microscope 10, such as via the controller. Either all or a subset of the functionality of each component may be exposed to the UI. The UI may automatically make changes to the components based on information it receives from the user, from other components, and/or at certain times or locations. The UI may thereby offer a simplified way to control various components of microscope 10.

Microscope 10 may be operated by a portable device providing that UI in the form of hardware and/or software. The portable device may be, for example, a tablet computer, smartphone, or other consumer device. For example, this UI may be a secondary interface, where a terminal that is local to microscope 10 constitutes the primary interface. This secondary interface can provide some or all of the functionality of the primary user interface, such as complete operation of microscope 10. Any number of these secondary interfaces may be adapted to control the instrument.

The UI may include a touch-screen interface to enhance interaction of the user with the microscope. For example, a pinching movement of the fingers or hand on the touchscreen may cause the image to grow or shrink. Dragging with a finger could cause the stage to move. It may also shift the current image immediately, estimating the appearance of the next image to acquire. Other gestures could perform other operations (e.g., two-finger drag could change astigmatism, etc.) The user could use a touch screen interface to perform all necessary actions on the microscope. These could include moving the sample, changing the field of view, focusing, stigmating, or otherwise tuning the image, changing the sample dwell time, changing the resolution, changing source intensity, etc. The UI may also be configured to synchronize and mediate between multiple devices connected to microscope 10.

The controller and the UI may provide two-way communication between the human user and microscope 10, such as feedback-based control of microscope 10 by the user. For example, the user may make a gesture at the UI, such as a swipe of a finger, that causes a stage movement or beam displacement to shift imaging in proportion to the swipe. The UI may then quickly refresh the image provided to the user for the new imaging location. The user may also make a gesture at the UI to change, for example, one or more imaging perspectives, brightness, or contrast, which may control detectors of the microscope, such as by turning them on or off or by triggering actuators that change the detectors' positions. For feedback-based control of microscope 10, it may be desirable to have two-way communications between UI and microscope 10 with suitably low latency in relation to human visual and tactile senses, and at least one-way communication from microscope 10 to UI with sufficiently high throughput to provide images to the user sufficiently quickly to give the user a sense of "real time" performance. In one embodiment, lower-resolution survey images may be provided to the user in substantially real time, and at a selected imaging location the user may request a higher resolution image that is not provided in real time. In one example, microscope 10 and the UI are adapted to have the stage respond to user commands with a latency of less than about 100 ms. In another example, microscope 10 and the UI are adapted to respond to user commands and give feedback or send a complete image from microscope 10 to the UI in less than about 1,000 ms, and preferably less than 500 ms.

The UI may be adapted to attempt to perform as many operations automatically as possible. For example, starting an application, or turning the device on may be interpreted as the user wanting to operate the microscope and it can attempt to turn on the microscope automatically. This could also happen in response to actions taken on the instrument itself; e.g., closing a door could interpreted as a cue to turn on the microscope. The microscope may be kept as "on" as possible, depending on power requirements or longevity of components.

As one example, automation may be provided around the changing of a sample in a charged-particle beam microscope (EM). Changing the sample may require venting to air a previously evacuated area, and may involve ramping the source voltage down to a safe level. Both steps may be performed automatically when the user starts the sample change. Once the change is complete the area is automatically evacuated and the high voltage automatically turns on. (If the instrument is running on batteries, however, this step may be postponed until later to preserve battery power.) The microscope would automatically get itself as ready as possible for imaging, for example ramping the filament to a temperature at which its lifetime is not shortened, but it remains near enough to the operating temperature that normal operation can be achieved relatively quickly without any stress to the filament. At this point the user could start the tablet computer, smartphone, or other consumer device, or even visit a website, at which point the microscope is automatically turned on fully (if running under batteries, this could be the point at which it performs the previous steps mentioned, having postponed preparation of the microscope for imaging until needed to preserve battery life).

Once the user has indicated that the imaging session is over, which could be either via a preprogrammed time limit, period of inaction or by closing an application, leaving a website, putting a device to sleep, or a suitable alternative method, the microscope returns to a "ready" state where the filament longevity is not reduced but the microscope is ready to start at a moment's notice. An example of the "ready" state may include leaving the high voltage energized and stable while turning the filament to a reduced current level to protect its longevity. If running under battery power, the microscope may skip this state and return to its minimum power state as soon as possible.

At some other point the microscope could enter its power off state, if for example an off button was pushed or an option in the software selected or some other indication that the microscope needed to power down. This could even be having the mains power removed from the microscope. At this point the microscope would safely shutdown any remaining components.

Power supplies and accessories of microscope 10 that operate at high potentials relative to ground may require communication over an isolation barrier to set voltages, measure values, and perform other types of control and/or acquisition operations. This may be accomplished using opto-isolators.

However, in another version, electrically isolated communications for an embodiment of a charged-particle beam microscope can be achieved using a wireless computer system. The receiver at the high voltage side (i.e., the microscope) may comprise a low-power microcontroller and power supply. The power supply may be derived over a potential gap using a transformer, or the microcontroller may be capable of being run off of battery power for an extended duration due to its low-power operation. Additionally, the power supply may be charged through inductive means while not operating.

FIG. 15 is a schematic diagram of an example of an embodiment of a system for electrically-isolated wireless communications between a user interface (UI) 810 and a charged-particle beam microscope. In this figure, the items enclosed in the dashed line are at high electrical potential, whereas items outside of the dashed line are at low electrical potential or ground potential. UI 810 may be implemented on a computer. The computer communicates with a controller 820 of microscope, which can control the microscope and/or read back data or other signals from the microscope. For example, controller 820 may control and/or read back data from power supply 830 for the charged-particle beam source filament by transmitting and receiving control commands and data through the wireless path, as shown.

One or more of the features of a charged-particle beam microscope described above—such as, for example, a monolithic optical column, modular subsystems, low power consumption, and the use of a remote and/or wireless UI rather than a local terminal—may allow microscope 10 to have an advantageously low weight. For example, microscope 10, including its controller and pumping system, may be adapted to have a weight of less than about 50 kg, or even less than about 30 kg. For example, a "Mochii" microscope weighing less than about 20 kg, including all components (such as optical system, power supplies, pumping systems, controllers, and UI devices), is commercially available from Mochii, Inc. (d/b/a Voxa) of Seattle, Wash.

Microscope 10 may have a characteristic area at the plane of sample 20 in which certain imaging characteristics, such as, for example, resolution or other optical characteristics, are selected to be within a range suited to the imaging that is performed. This area may be referred to as the "field of view" of microscope 10 for certain versions. Within the field of view, a charged-particle beam or light beam may be scanned in one or more scanning areas across sample 20 while remaining within the desired range of optical characteristics (such as high resolution). In the case of a charged-particle beam, the scanning may be performed by electronic shifting, such as by generating an electric or magnetic field.

Within each field of view, microscope 10 may define one or more scanning areas of sample 20 (e.g., areas in which a charged-particle beam or light beam will be scanned) contribute to the final image. Microscope 10 may perform the imaging of sample 20 in one or more cycles corresponding to the scanning areas, each imaging cycle for a scanning area yielding a contribution that is referred to here as a sub-image. Each scanning area may be noncontiguous, contiguous, or overlapping in relation to scanning areas within the same field of view or scanning areas in different fields of view. Moreover, the scanning areas may even be a combination of noncontiguous (i.e., with edges separated by a space), contiguous (i.e., edge to edge), or overlapping.

The controller may stitch together the sub-images to produce a partially or wholly comprehensive image of sample 20. For example, where there are overlapping or contiguous sub-images, these sub-images may be joined together to yield imaging data that is continuous across the corresponding scanning areas. For overlapping sub-images, the controller may use the redundant image information at the overlap to accurately join the sub-images together into a comprehensive image. The controller may automatically control the acquisition of sub-images along a set path, for example a raster pattern or a zig-zag pattern. Further, new data may automatically be integrated into a large map (e.g., a map of substantially the whole sample) as sub-images are acquired so as to fill in the large map with available information.

In a scanning microscope (e.g., a confocal light microscope, STEM, SEM, atomic force microscope, scanning tunneling microscope), the precise scan paths may even be defined according to the particular application. For example, the location of the beam or probe can be set to any position, for any time duration, along the scan path.

In one version, as a new image is being acquired, the controller aligns or otherwise conforms the new image to one or more previously generated images. For example, the controller may process newly detected pixel data to decide on or alter future imaging locations, such as to fill in gaps in imaging or to try to align the new image vertically or horizontally with one or more of the previously generated images. In another example, the controller processes newly detected pixel data to decide on or alter future image resolution or time spent at a particular location. For example, the controller may estimate a likely significance of the image at a predetermined location, and the controller may use that estimate to increase or decrease resolution or another image quality parameter for imaging at that location or nearby. These adjustments can alternatively or additionally be calculated between imaging cycles to affect the next new cycle of image acquisition.

In one embodiment of a scanning microscope, the controller controls the stage and/or beam scanners to move the beam or probe relative to the sample in a stochastic, path-dependent, or self-correcting fashion. This may be especially advantageous for electron beam microscopy due to the relatively fast response time of the electron beam to the scanning signal. For example, the controller may start creating an image by shifting the electron beam a small amount using a selected one of the beam scanners. The controller may then measure the magnitude of the shift actually produced, and use that measurement to change the amount and direction of the next shift. After more shifts and measurements have been performed, the controller may learn the strength, direction, and repeatability of the beam scanners and/or the stage. The controller may then use this learned information to produce substantially orthogonal or otherwise intentionally directed shifts at a suitable distance for stitching a larger image together. Furthermore, the controller may use the early images, although not acquired using optimal shifts, to prepare the stitched images, such that the time spent characterizing the shifts is not wasted.

Although performing these steps while images are acquired live is possible, the analysis may also be performed off-line. Although it may not be possible to optimize shifts for the previously acquired image after it has occurred, that image may provide useful information for future image acquisitions.

As another example, as an image is tiled, areas of low or zero contrast may be identified. When images from that region are next imaged, the imaging system could spend less time on that area, or measure it at a lower resolution. This could be done at a faster rate than when acquiring normal quality images and lead to a speed up in total image acquisition time, while not affecting the quality of the image in the important areas. Lower quality images can be checked to insure that they really do represent a low-interest region, and if it is determined they do not, the image could be reacquired at higher or regular resolution.

The controller may also be adapted to increase the quality of the image at or near a feature of interest, and decrease the quality of the image (while increasing imaging speed) with increasing distance from that feature of interest.

The controller of a scanning microscope may also control the stage and/or beam scanners to produce alternative scanning patterns. For example, the controller may scan the beam or probe across the sample in space-filling curve patterns. Space-filling curves may include, for example, a Hilbert curve, Peano curve, or another suitable type of progressively finer scanning curve. These scans can achieve progressively finer detail over time, such as by incrementally increasing the order of the curve, allowing users to decide whether to continue scan based on coarser, earlier data.

The above methods could be applied in real-time to data as it is acquired and shown to the user immediately. The user could then cancel the acquisition if needed or manually highlight areas of interest that could be acquired at higher quality.

In one version, microscope 10 may generate at least two types of images of sample 20. The first category is survey images, which may be taken to generate a high-framerate survey video. These survey images may be used for tuning the microscope, and finding the appropriate area of the sample on which to conduct more detailed imaging. The second category is high-resolution images. When imaging in the high-resolution mode, the microscope may be slower and less responsive than in the survey mode, but can provide more detail and less noise than the survey images, or signals that may be unavailable at high framerates (e.g., x-ray composition data).

In one embodiment, microscope 10 performs a preliminary, lower-resolution imaging of sample 20 before a principal, higher-resolution imaging of sample 20. The preliminary imaging may be, for example, a faster or lower-dose scan of sample 20 used to determine the locations of one or more features of interest in sample 20. These features may include, for example, a specific cell body with a tag that sets it apart from other cell bodies, or each of multiple polymer strands. This scan may, in one embodiment, cover a substantially contiguous area, rather than being limited to particular and discrete scanning areas. Surveying may also be performed outside of microscope 10, where fiducials on sample 20 or another registration mechanism is provided, such as using a different type of charged-particle microscope or alternatively an optical microscope (such as for fluorescent or light-visible tags).

The controller may then define the scanning areas such that the scanning areas track sample 20 based on the determined location of sample 20. By defining scanning areas that track sample 20, microscope 10 may be able to avoid even more empty area where areas of interest of the sample are not present, eliminating wasteful acquisition of pixels and providing effectively faster imaging speeds. Using the scanning areas, the controller may perform a slower or higher-resolution scan within the scanning areas, thus concentrating the imaging on the actual location of sample 20 and thereby improving efficiency. For example, within each scanning area microscope 10 may raster scan the beam or probe.

Data streamed from microscope 10 by the UI may be adjusted dynamically and automatically such that the user experience is enhanced based on the UI context. For example, microscope 10 may be configured to automatically transition between data densities and latencies based on input from the user to provide an improved user experience. Further, microscope 10 may be configured to predictively acquire and cache image data to be served on a contextual basis to the client UI. While adjustment of datastream mode and latency can be applied to serially-acquired data as well, the above description also applies data acquired through parallel means, such as from a CCD camera.

It is typically desirable to have the image that is produced by the imaging system accurately represent information in the sample needed for analysis. In the ideal case of perfect imaging, the image faithfully reproduces the features of the sample that are needed for analysis. In the real world, however, imaging is often imperfect. In some cases, distortions due to imperfect imaging conditions can result in a warped image. In beam-optical microscopes, these distortions may be caused, for example, by instabilities in the environment such as stray electric or magnetic fields, mechanical vibrations, temperature fluctuations, or internal instabilities such as power supply ripple, ground noise, or periodic electrical discharges.

In a beam-optical microscope, the controller may be adapted to automatically diagnose the magnitudes of various aberrations and apply compensating signals to the optical system, such as to one or more of the optical elements that may cause aberrations and/or the aberration corrector (e.g., aberration corrector 90). Microscope 10 may be especially adapted to correct for two types of image distortions: (1) distortions that are periodic in time, and (2) distortions that are static in time. An example of the first type involves displacement of the beam-probe location due to mains AC fields.

One exemplary method is to raster scan one or more tuning regions of sample 20 to generate an image and to analyze the generated image to extract information about aberrations that can be used to correct the aberrations. The tuning regions may be of any shape or size and may be located within or outside of the areas to be scanned.

Distortions can be diagnosed by analyzing images of the same sample taken using different scan parameters. Based on the types of distortions to correct, more images may be generated that have different rotations, sampling frequency, sampling spacing, magnification, etc. Periodic and static distortions can be extracted from some or all of the above comparisons, based on assumptions about the distortions.

For example, in a conventionally rastered image, wherein the fast "x" direction represents the pixel scan that increments each pixel clock, and the slower "y" direction represents the line scan that increments only after a full pixel width of the field of view is acquired, an image can be recorded with the fast, "x" direction, then another image of the same sample can be acquired in a direction that is rotated by approximately 90 degrees in relation to the previous "x" direction. By comparing the location of features between the two images of the same sample, a map of distortion can be calculated across either image.

Another exemplary method for a charged-particle beam microscope is to acquire one or more images as a function of illumination tilt and defocus, and to extract the blurring effect of the tilt and defocus. The blurring gives a value for the defocus and astigmatism at a variety of angles. This process can provide sufficient data to numerically compute an aberration function for the imaging system. Yet another method is to defocus the charged-particle beam and use a bright-field detector (e.g., bright-field detector 210C), such as a CCD camera, to generate a Ronchigram image, or a plurality of Ronchigram images taken at different positions of sample 20, and then refocus the charged-particle beam for continued imaging of the sample. The Ronchigram image can provide sufficient aberration information to derive optical parameters that permit suitable compensation for these aberrations.

Once distortions are measured the data can be presented to the user as a measure to help diagnose instabilities. It could also be used as input to a post processing algorithm to remove distortions. This algorithm could be applied to future images assuming the distortions remain constant. It could also be used and fed back in to the scanning unit to correct for the distortions by changing the scanning locations (e.g., moving the beam to a location where adding the measured distortion will place the beam at the required location). Following the application of any of these or other correcting techniques, the process could be applied again iteratively, each time measuring and potentially correcting finer distortions.

A sample used for the purposes of diagnosing aberrations in a charged-particle beam microscope may contain, for example, single atoms or clusters of atoms, or may be another kind of sample adapted to permit microscope 10 to diagnose optical aberrations. For example, the sample may be the same sample 20 that is also the subject of interest for study. Alternatively, the sample may be a reference sample used solely for calibration of microscope 10. Distortions relative to the known structure of the reference sample can then be extracted.

The tuning region may be positioned to account for workflow convenience. For example, the tuning region may be located at a default (or "home") position of stage 40 so that it may be used to tune microscope 10 prior to imaging sample 20 and the user can always be presented with a substantially optimized image of sample 20.

In one version, microscope 10 even contains a mechanism for inserting the reference sample into the beam path for calibration, and retracting the reference sample when it is not being imaged. In this version, the reference sample may even be kept inside microscope 10 such that the mechanism can readily insert the reference sample into the beam path for calibration of microscope 10.

The reference sample may mounted on a rod, which can temporarily insert the reference sample into the field of view of microscope 10 for calibration. The controller may execute this calibration only when the sample to be imaged is first inserted, or alternatively the controller may execute this calibration repeatedly during operation.

Identification of samples used for conventional microscopy may conventionally pose a challenge, especially in terms of efficiently identifying and imaging multiple samples in sequence. As the number of samples to be imaged is increased due to other innovations, keeping track of the identities of the samples becomes even more problematic. With the potentially larger number of observed samples due to these innovations, keeping track of samples may be even more challenging. Thus, an identification system is described that permits an identification pattern to be placed on sample 20 and read by the microscope. This improves the efficiency of identifying and tracking multiple samples.

An identification pattern may be placed on sample 20 temporarily or permanently. For example, the identification pattern may be a removable sample label that is placed on sample 20 or a sample holder, or patterned onto sample 20 or the sample holder using an electron beam of microscope 10 adjusted with elevated current or laser of SLM-SEM 680A, 680B. The patterning could be carried out on a beam-sensitive label area of sample 20, comprising, for example, a beam-sensitive sacrificial polymer, or an etchable substrate catalyzed by exposure to a beam. Alternatively, the identification pattern may be etched onto sample 20. The identification pattern may contain a unique identification code that can be determined when the pattern is read by one or more means. For example, the pattern may comprise a miniature bar code, QR code, or another type of code based on a geometric pattern. The pattern may be visible to photons and/or charged particles. The identification code may be inserted into the metadata of images of the sample that are generated by the microscope, providing convenient tracking of the sample.

A reference pattern may also be placed on the sample to enable quick calibration of microscope 10, such as focusing in the case of a beam-optical microscope, by imaging of the reference pattern. For example, microscope 10 may perform this calibration substantially automatically. The reference pattern may be placed at a location of the sample that is predetermined relative to the stage. The same reference pattern may be used on different samples to enable microscope 10 to be calibrated by imaging the reference pattern.

Furthermore, a combination identification/reference pattern may be provided in which the pattern provides an identification code and the same pattern is also used for calibration of the microscope. In this version, microscope 10 may, on insertion of the sample, read the identification code from the pattern and simultaneously calibrate microscope 10 based on the pattern, readying microscope 10 for imaging of the sample.

As a charged-particle beam microscope is operated, various parameters may undesirably vary over time. This may conventionally necessitate vigilance and maintenance by the user. For example, the user may have to monitor the parameters and, for example, instruct the controller to turn off the charged-particle beam source if a particular value falls below a predefined threshold. This may increase the burden on the user and negatively impact ease of use of the microscope.

To address this, the controller may automatically monitor important operating parameters. The controller may also automatically make changes to keep the parameters within suitable ranges. Alternatively, the controller may make these changes at times that are appropriate or convenient to the user, such as between imaging cycles.

In one example of charged-particle beam microscopy, the controller monitors the emission current to maintain desired operating conditions of microscope 10. The controller can change the emission current by varying the voltage at the Wehnelt. However, doing so while imaging may cause detrimental effects in the images. Therefore, the controller may vary the voltage at the Wehnelt to make these adjustments at times that imaging is not occurring.

In another example of charged-particle beam microscopy, the controller may monitor the filament temperature, resistance, and/or current and adjust the power supply accordingly to keep these values within predefined (e.g., user-defined) ranges. The controller may optionally make these adjustments only at appropriate times, such as when image acquisition is not occurring.

Thus, by automatically monitoring and correcting those parameters, microscope 10 may substantially avoid the need for human intervention in regard to those parameters and therefore even be able to hide the existence of those parameters from the user. This can make operation of microscope 10 much simpler and easier for the user, who can in turn focus on his or her ultimate desired use of microscope 10.

The controller may also evaluate information originating at one or more of the detectors of a beam-optical microscope, either between imaging cycles or simultaneous with imaging, to determine the current quality of imaging. In one version, imaging information from dedicated "tuning regions" is used. However, the images themselves may additionally or alternatively be used. For example, information from the most recent images can be used to determine trends of tuning deterioration. This evaluation can be used to set parameters of microscope 10 to improve the quality of imaging. For example, referring to FIG. 1 for the sake of illustration, the parameters may be applied to condenser lenses (e.g., condenser lenses 70A-C), the objective lens (e.g., objective lens 100), the aberration corrector (e.g., aberration corrector 90), and the stage (e.g., stage 15). In an illustrative example, the parameters applied to the condenser lenses, the objective lens, and the stage may improve the focus, while the parameters applied to the aberration corrector may compensate for higher orders of aberration. This process may be referred to as "re-tuning" the microscope.

It may be desirable to maintain the microscope in a substantially steady state in terms of contamination and stability during imaging. But the performance of the optical system of a charged-particle beam microscope may tend to deteriorate over time. In one example, the optical system of a charged-particle beam microscope may deteriorate to an undesirable state in from about 5 to about 30 minutes, such as about 15 minutes. When this happens, it may become advantageous to perform re-tuning. In one version, first-order and second-order aberrations may be especially prone to deterioration and/or advantageous to compensate for by re-tuning. The charged-particle beam source may also deteriorate over time. To refresh the charged-particle beam source, it can be "flashed" by running a high current through it between beam scanning cycles. This causes a localized heating of the filament that reconditions the source.

Re-tuning of a charged-particle beam microscope may be triggered according to any suitable procedure. The controller may monitor the microscope to initiate the determination of imaging quality, the controller may automatically initiate re-tuning at regular intervals, or the controller may poll a store of recently generated images to determine image quality as a background process. For example, the re-tuning may be triggered within any desired time interval, such as within any quantity of hours or minutes, or subsequent to any quantity of images generated by the microscope or every Nth linear scan or scan cycle performed by the microscope. In an exemplary embodiment, the controller initiates re-tuning between sequential fields of view. In another embodiment, however, the controller can re-tune the optical system between sequential scanning areas.

At each of the sub-areas, microscope 10 may image a tuning region within or outside of the sub-area one or more times to generate one or more sub-images that can be used to track the sample and/or produce imaging metadata. The imaging metadata may include, for example, focus error and amounts of various orders of aberration, and beam current. The controller may use the imaging metadata to modify parameters to improve image quality, such as, for example, to autofocus the image at the elevation of sub-area. For example, the controller may evaluate several sub-images taken in a particular area to determine the magnitude and direction of focus error. Using this information, microscope 10 can generate a final well-focused sub-image that will be used for evaluation of the sample itself. Microscope 10 may use any number of sub-images of a sample to determine imaging metadata. The sub-images may cover any desired variation range for a particular parameter.

In analyzing an image, the controller may analyze any suitable characteristics of the image, such as intensity, pixel counts, or power, each of which may be analyzed in real space or in frequency space (so that intensity may be within or outside of a spatial frequency range). When comparing images or evaluating a series of images, the controller may utilize any suitable characteristic that differs between the images, such as in a preselected region of the images.

The controller may also use any number of images for the image quality comparison, where the image quality values for current and prior images may be combined in any suitable fashion, such as averaged, weighted, or summed. A user threshold for image quality may be set to any suitable value. A comparison of image quality values may utilize any mathematical or statistical operations to determine image quality compliance, such as a comparison, statistical variance, or deviation.

The imaging process may be performed automatically, such as after initiation by a user or initiation by a larger process of which the imaging is a subprocess. Parameters may be determined automatically and applied to the microscope. Alternatively, any part of the technique, such as image generation, determination of parameters, or application of the parameters, may be performed manually. For example, the controller or a separate computer system may provide the optimal settings to a technician who manually applies the settings to the microscope. The microscope controller may perform any desired processing, such as monitoring and adjustment of optical parameters or image formation and processing. For example, the controller may align images using image registration algorithms. The controller of a beam-optical microscope may also adjust the aberrations and defocus of an image based on characteristics of a previous image.

Microscope 10 may be used in any suitable facility in any desired arrangement, such as networked, direct, or indirect communication arrangements. Moreover, the various functions of microscope 10 may be distributed in any manner among any quantity of components, such as one or more hardware and/or software modules or units. The hardware may include microscopes, machine managers, computer or processing systems, circuitry, networks, and image stores, that may be disposed locally or remotely of each other and may communicate with each other or be coupled to each other in any suitable manner, such as wired or wireless, over a network such as WAN, LAN, Intranet, Internet, hardwire, or modem, directly or indirectly, locally or remotely from each other, via any communications medium, and utilizing any suitable communication protocol or standard. The software and/or algorithms described above may be modified in any manner that accomplishes the functions described herein.

Microscope 10 described herein, in the case of a charged-particle beam microscope, may be implemented with either electrostatic or magnetic components or a combination thereof. The microscope may include any quantity of electrostatic or magnetic components, such as an electron or other charged-particle gun, lenses, a dispersion device, stigmators, deflectors, detectors, and stages, arranged within or outside of the microscope in any suitable fashion.

Image stores, files, and folders used by microscope 10 may be of any quantity and may be implemented by any storage devices, such as memory, database, or data structures. Implementation of aspects of the microscope, such as image processing or the user interface, may be distributed among the controller or other processing devices in any desired manner, where these devices may be local or remote in relation to one another. The controller may communicate with and/or control the microscope to perform any desired functions, such as scanning the sample and generating the images or transferring images to memory.

Although the foregoing embodiments have been described in detail by way of illustration and example for purposes of clarity of understanding, it will be readily apparent to those of ordinary skill in the art in light of the description herein that certain changes and modifications may be made thereto without departing from the spirit or scope of the appended claims. It is also to be understood that the terminology used herein is for the purpose of describing particular aspects only, and is not intended to be limiting, since the scope of the present invention will be limited only by the appended claims.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only," and the like in connection with the recitation of claim elements, or use of a "negative" limitation. As will be apparent to those of ordinary skill in the art upon reading this disclosure, each of the individual aspects described and illustrated herein has discrete components and features which may be readily separated from or combined with the features of any of the other several aspects without departing from the scope or spirit of the disclosure. Any recited method can be carried out in the order of events recited or in any other order which is logically possible. Accordingly, the preceding merely provides illustrative examples. It will be appreciated that those of ordinary skill in the art will be able to devise various arrangements which, although not explicitly described or shown herein, embody the principles of the disclosure and are included within its spirit and scope.

Furthermore, all examples and conditional language recited herein are principally intended to aid the reader in understanding the principles of the invention and the concepts contributed by the inventors to furthering the art, and are to be construed without limitation to such specifically recited examples and conditions. Moreover, all statements herein reciting principles and aspects of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary configurations shown and described herein. Rather, the scope and spirit of present invention is embodied by the claims.

In this specification, various preferred embodiments have been described with reference to the accompanying drawings. It will be apparent, however, that various other modifications and changes may be made thereto and additional embodiments may be implemented without departing from the broader scope of the claims that follow. The specification and drawings are accordingly to be regarded in an illustrative rather than restrictive sense.

We claim:

1. A charged-particle beam microscope for imaging a sample, the microscope comprising:
   a vacuum chamber to maintain a low-pressure environment;
   a stage to hold a sample in the vacuum chamber;
   a charged-particle beam source to generate a charged-particle beam;
   charged-particle beam optics to converge the charged-particle beam onto the sample;
   a detector to detect charged-particle radiation emanating from the sample;
   a controller to analyze the detected charged-particle radiation to generate an image of the sample; and
   a power supply comprising a battery to power at least the charged-particle beam optics and the controller, the power supply being adapted to maintain the charged-particle beam source at an electrical potential of −1 kV or higher magnitude relative to microscope ground.

2. A charged-particle beam microscope according to claim 1, wherein the controller is adapted to wirelessly receive one or more control commands to the controller.

3. A charged-particle beam microscope system according to claim 1, wherein the controller comprises one or more radio frequency (RF) receivers.

4. A charged-particle beam microscope according to claim 1, wherein the charged-particle beam microscope weighs less than about 50 kg.

5. A charged-particle beam microscope system according to claim 1, wherein the charged-particle beam microscope weighs less than about 20 kg.

6. A charged-particle beam microscope system according to claim 1, wherein the charged-particle beam microscope has a total power consumption of less than about 275 W.

7. A charged-particle beam microscope system for imaging a sample, the system comprising:
   a charged-particle beam microscope comprising:
   a vacuum chamber to maintain a low-pressure environment;
   a stage to hold a sample in the vacuum chamber;
   a charged-particle beam source to generate a charged-particle beam, the charged-particle beam source comprising a source power supply and a source microcontroller;
   charged-particle beam optics to converge the charged-particle beam onto the sample;
   a detector to detect charged-particle radiation emanating from the sample;
   a controller to wirelessly communicate with the source microcontroller and to analyze the detected charged-particle radiation to generate an image of the sample; and
   a computer adapted to be in wireless communication with the controller of the microscope,
   wherein the source power supply and the source microcontroller are adapted to be maintained at an electrical potential of −1 kV or higher magnitude relative to the microscope ground.

8. A charged-particle beam microscope system according to claim 7, wherein the controller is adapted to run a user interface.

9. A charged-particle beam microscope system according to claim 7, further comprising a power supply that comprises a battery.

10. A charged-particle beam microscope system according to claim 7, wherein the controller and the computer are adapted to communicate with each other using one or more radio frequency (RF) transceivers.

11. A charged-particle beam microscope system according to claim 7, wherein the computer is adapted to transmit one or more control commands to the controller.

12. A charged-particle beam microscope system according to claim 7, wherein the controller is adapted to transmit image data to the computer.

13. A charged-particle beam microscope system according to claim 7, wherein the charged-particle beam microscope weighs less than about 50 kg.

14. A charged-particle beam microscope system according to claim 7, wherein the charged-particle beam microscope weighs less than about 20 kg.

15. A charged-particle beam microscope system according to claim 7, wherein the charged-particle beam microscope has a total power consumption of less than about 275 W.

16. A charged-particle beam microscope for imaging a sample, the microscope comprising:
   a charged-particle beam source in an inner gun volume to generate a charged-particle beam;
   a stage to hold a sample in an external environment;
   a vacuum chamber to maintain a differential pressure ratio between the external environment and the inner gun volume of from 10 to $1 \times 10^5$;
   charged-particle beam optics to converge the charged-particle beam onto the sample;
   a detector to detect charged-particle radiation emanating from the sample;
   a controller to analyze the detected charged-particle radiation to generate an image of the sample; and
   a power supply to power at least the charged-particle beam optics and the controller,
   wherein the charged-particle beam microscope weighs less than about 50 kg.

17. A charged-particle beam microscope system according to claim 16, wherein the charged-particle beam microscope has a total power consumption of less than about 275 W.

18. A charged-particle beam microscope system according to claim 16, wherein the charged-particle beam microscope has a total power consumption of less than about 100 W.

19. A charged-particle beam microscope system according to claim 16, wherein the power supply comprises a battery.

20. A charged-particle beam microscope for imaging a sample, the microscope comprising:
- a vacuum chamber to maintain a low-pressure environment;
- a motorized stage to hold and move a sample in the vacuum chamber;
- a charged-particle beam source to generate a charged-particle beam;
- charged-particle beam optics to converge the charged-particle beam onto the sample;
- a detector to detect charged-particle radiation emanating from the sample;
- a controller to analyze the detected charged-particle radiation to generate an image of the sample;
- a power supply to power at least the charged-particle beam optics and the controller; and
- a computer adapted to be in wireless communication with the controller of the microscope and to wirelessly control the motorized stage to move the sample in the vacuum chamber, wherein the charged-particle beam microscope weighs less than about 50 kg.

21. A charged-particle beam microscope system according to claim 20, wherein the motorized stage comprises a piezoelectric motor to move the stage.

22. A charged-particle beam microscope for imaging a sample, the microscope comprising:
- a vacuum chamber to maintain a low-pressure environment;
- a motorized stage to hold and move a sample in the vacuum chamber;
- a charged-particle beam source to generate a charged-particle beam;
- charged-particle beam optics to converge the charged-particle beam onto the sample;
- a detector to detect charged-particle radiation emanating from the sample;
- a controller to analyze the detected charged-particle radiation to generate an image of the sample; and
- a power supply to power at least the charged-particle beam optics and the controller, wherein the charged-particle beam microscope weighs less than about 50 kg.

23. A charged-particle beam microscope system according to claim 22, wherein the motorized stage comprises a piezoelectric motor to move the stage.

* * * * *

UNITED STATES PATENT AND TRADEMARK OFFICE
CERTIFICATE OF CORRECTION

PATENT NO. : 10,847,343 B1  
APPLICATION NO. : 15/899349  
DATED : November 24, 2020  
INVENTOR(S) : Own et al.

Page 1 of 1

It is certified that error appears in the above-identified patent and that said Letters Patent is hereby corrected as shown below:

In the Claims

In Claim 2, Column 33, Lines 48-49:
"wherein the controller is adapted to wirelessly receive one or more control commands to the controller"
Should read:
—wherein the controller is adapted to wirelessly receive one or more control commands from the computer—.

Signed and Sealed this
Twenty-ninth Day of December, 2020

Andrei Iancu
*Director of the United States Patent and Trademark Office*